(12) United States Patent
Shim et al.

(10) Patent No.: US 11,355,205 B2
(45) Date of Patent: Jun. 7, 2022

(54) MEMORY DEVICE

(71) Applicant: SAMSUNG ELECTRONICS CO., LTD., Suwon-si (KR)

(72) Inventors: Sangwon Shim, Seoul (KR); Sangwon Park, Seoul (KR); Bongsoon Lim, Seoul (KR); Yoonhee Choi, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/172,288

(22) Filed: Feb. 10, 2021

(65) Prior Publication Data

US 2022/0068403 A1    Mar. 3, 2022

(30) Foreign Application Priority Data

Aug. 27, 2020  (KR) .................... 10-2020-0108582

(51) Int. Cl.
| | | |
|---|---|---|
| *G11C 16/30* | (2006.01) | |
| *H01L 25/065* | (2006.01) | |
| *H01L 25/18* | (2006.01) | |
| *H01L 23/00* | (2006.01) | |
| *G11C 5/14* | (2006.01) | |

(52) U.S. Cl.
CPC ............. *G11C 16/30* (2013.01); *G11C 5/14* (2013.01); *H01L 24/05* (2013.01); *H01L 24/08* (2013.01); *H01L 25/0657* (2013.01); *H01L 25/18* (2013.01); *H01L 2224/05147* (2013.01); *H01L 2224/08145* (2013.01); *H01L 2924/1431* (2013.01); *H01L 2924/14511* (2013.01)

(58) Field of Classification Search
None
See application file for complete search history.

(56) References Cited

U.S. PATENT DOCUMENTS

| | | | | |
|---|---|---|---|---|
| 5,301,161 A | * | 4/1994 | Landgraf | G11C 5/143 365/185.04 |
| 5,428,579 A | | 6/1995 | Robinson et al. | |
| 5,896,338 A | | 4/1999 | Langraf et al. | |

(Continued)

OTHER PUBLICATIONS

European Search Report dated Oct. 5, 2021, Cited in EP 21169835.2.

*Primary Examiner* — Tan T. Nguyen
(74) *Attorney, Agent, or Firm* — Volentine, Whitt & Francos, PLLC

(57) ABSTRACT

A memory device includes a first memory area including a first memory cell array having a plurality of first memory cells and a first peripheral circuit disposed below the first memory cell array; a second memory area including a second memory cell array having a plurality of second memory cells and a second peripheral circuit disposed below the second memory cell array; and a pad area including a power wiring. The first and second memory areas respectively include first and second local lockout circuits separately determining whether to lock out of each of the memory areas. The first and second memory areas are included in a single semiconductor chip to share the pad area, and the first and second memory areas operate individually. Accordingly, in the memory device, unnecessary data loss may be reduced by selectively stopping an operation of only a memory area requiring recovery.

20 Claims, 21 Drawing Sheets

(56) References Cited

U.S. PATENT DOCUMENTS

| | | |
|---|---|---|
| 7,463,543 B2 | 12/2008 | Kwak |
| 8,904,161 B2 | 2/2014 | Shim et al. |
| 10,599,503 B2 | 3/2020 | Rahmanian et al. |
| 10,629,288 B2 | 4/2020 | Cariello |
| 2008/0239780 A1 | 10/2008 | Sasaki et al. |
| 2010/0191999 A1 | 7/2010 | Jeddeloh |
| 2012/0250443 A1 | 10/2012 | Saraswat et al. |
| 2015/0082062 A1 | 3/2015 | Saraswat et al. |
| 2019/0042156 A1 | 2/2019 | De Santis et al. |
| 2019/0087331 A1 | 3/2019 | Lappi et al. |

* cited by examiner

MEMORY DEVICE

CROSS-REFERENCE TO RELATED APPLICATION(S)

This application claims the benefit under 35 USC 119(a) of Korean Patent Application No. 10-2020-0108582 filed on Aug. 27, 2020, in the Korean Intellectual Property Office, the entire disclosure of which is incorporated herein by reference for all purposes.

BACKGROUND

The present disclosure relates to a memory device.

A memory device, particularly a flash memory device, as one type of a nonvolatile memory device, operates from an external power source. The flash memory device may not operate normally when Sudden-Power Off (SPO) occurs during operations or when an external voltage is lowered. In order to compensate for the low voltage characteristics of such memory devices and to protect the operation circuit, the memory device terminates the operation of the memory device and performs recovery when the level of the operating voltage is lower than a predetermined voltage level using a lockout circuit. Meanwhile, the memory device may perform a Plane Independent Core (PIC) operation in which any one of a program, a read, or an erase operation is independently performed for each Memory Array Tile (MAT). However, even during a PIC operation in which a different operation is performed for each MAT of the memory device, there is a problem that the lockout is performed in units of chips, resulting in unnecessary data loss.

SUMMARY

Example embodiments provide a memory device in which unnecessary data loss may be reduced by performing lockout for each MAT in a PIC operation of performing different operations for respective MATs of the memory device.

According to example embodiments, a memory device includes a first memory area including a first memory cell array having a plurality of first memory cells. A first peripheral circuit controls the first memory cells and is disposed below the first memory cell array. A second memory area includes a second memory cell array having a plurality of second memory cells. A second peripheral circuit controls the second memory cells and is disposed below the second memory cell array. A pad area includes a power wiring. The first memory area includes a first local lockout circuit determining whether to lock out during an operation of the first memory area. The second memory area includes a second local lockout circuit determining whether to lock out separately from the first memory area during an operation of the second memory area. The first memory area and the second memory area are included in a single semiconductor chip to share the pad area, and the first memory area and the second memory area individually operate.

According to example embodiments, a memory device includes a memory cell area including a plurality of MATs, each including a plurality of memory cells. A peripheral circuit area is disposed below the memory cell area. A pad area is disposed on a side surface of the memory cell area and includes a power wiring. The plurality of MATs operate individually by an operating voltage applied based on external power. The peripheral circuit area individually stops an operation and performs recovery when the operating voltage is lower than a lockout voltage during the operation of the plurality of MATs. The memory cell area includes at least two MATs having the operating voltage and the lockout voltage different from each other.

According to example embodiments, a memory device includes a memory cell area including a first metal pad. A peripheral circuit area includes a second metal pad. A pad area is disposed on a side surface of the memory cell area and includes a wiring applying external power to the peripheral circuit area. A plurality of MATs are included in the memory cell area and each includes a plurality of memory cells. A lockout circuit is respectively disposed in the plurality of MATs or in the peripheral circuit area below the plurality of MATs. The peripheral circuit area is vertically connected to the memory cell area by the first metal pad and the second metal pad and applies an operating voltage to the plurality of MATs based on the external power applied from the pad area. The plurality of MATs operate individually by the operating voltage, and the lockout circuit individually determines whether to lock out the plurality of MATs.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments will be described with reference to the accompanying drawings.

Figure 1A:
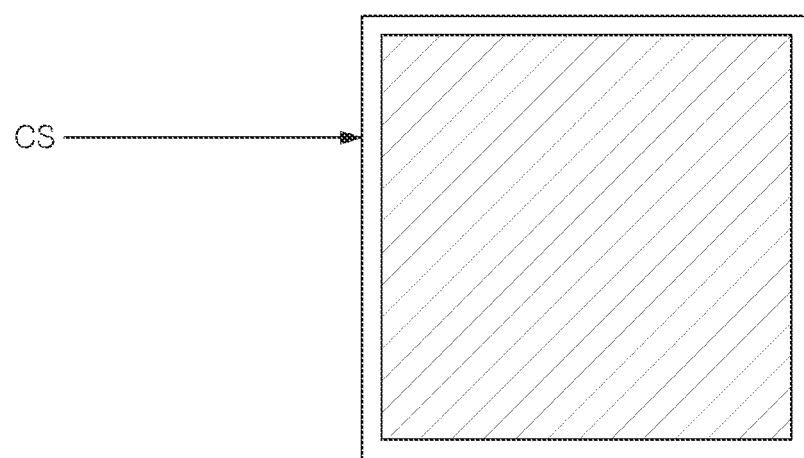
FIGS. 1A and 1B are diagrams illustrating an operation of a memory device according to an example embodiment.
Figure 1B:
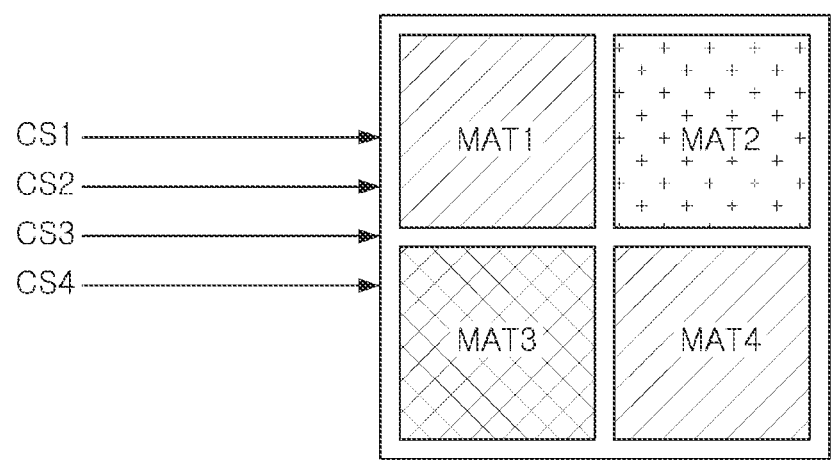

FIGS. 1A and 1B are diagrams illustrating an operation of a memory device according to an example embodiment.

Recently, due to an increase in the amount of data stored in the memory device, a memory device having an improved degree of integration may be required. In order to improve the integration degree of the memory device and increase the storage capacity, the number of memory cells included in the memory device may be increased. A set of memory cells included in a memory device forms a memory cell array, and as the number of memory cells increases, the size of the memory cell array may increase.

Referring to FIG. 1A, in general, one memory cell area may include a memory cell array comprised of a plurality of memory cells that perform one operation at a time. As an example, the memory cell area may receive one control signal CS and perform any one of a read operation, a program operation, and an erase operation. A predetermined time is taken in performing each operation.

On the other hand, as the size of the memory cell array increases, the wiring connected to the memory cell may be lengthened, and the parasitic capacitance of the wiring may increase, thereby increasing the time required for charging and/or discharging the memory cell. In other words, time required for data read, program, and erase operations may increase.

To solve the above problem, a method of dividing one memory cell area into a plurality of memory cell arrays may be used. For example, the divided memory cell array may be defined as a plurality of Memory Array Tiles (MATs). A peripheral circuit corresponding to each of the MATs may be disposed around the plurality of MATs, thereby compensating for a problem of a memory device including an undivided memory cell array.

Referring to FIG. 1B, the semiconductor chip may be divided into four MATs MAT1, MAT2, MAT3, and MAT4 and the four MATs MAT1, MAT2, MAT3, and MAT4 may be arranged in a 2×2 shape. However, this is only an example and the present invention is not limited thereto and the number of MATs may be 2, 3, 5 or more. In addition, the arrangement of the MAT may also be different from the shape illustrated in FIG. 1B. A memory device according to an example embodiment will be described on the assumption that it has the MAT arrangement illustrated in FIG. 1B.

In the memory device according to the example embodiment, peripheral circuits respectively corresponding to the plurality of MATs MAT1, MAT2, MAT3, and MAT4 may operate independently. As an example, independent control signals CS1, CS2, CS3, and CS4 may be respectively input to the plurality of MATs MAT1, MAT2, MAT3, and MAT4. The plurality of MATs MAT1, MAT2, MAT3, and MAT4 receiving any one of the control signals CS1, CS2, CS3, and CS4 may perform an operation according to the received control signal. The operation of the plurality of MATs MAT1, MAT2, MAT3, MAT4 may be one of read, program, and erase operations, and the plurality of MATs MAT1, MAT2, MAT3, MAT4 may simultaneously perform different operations.

Figure 2A:
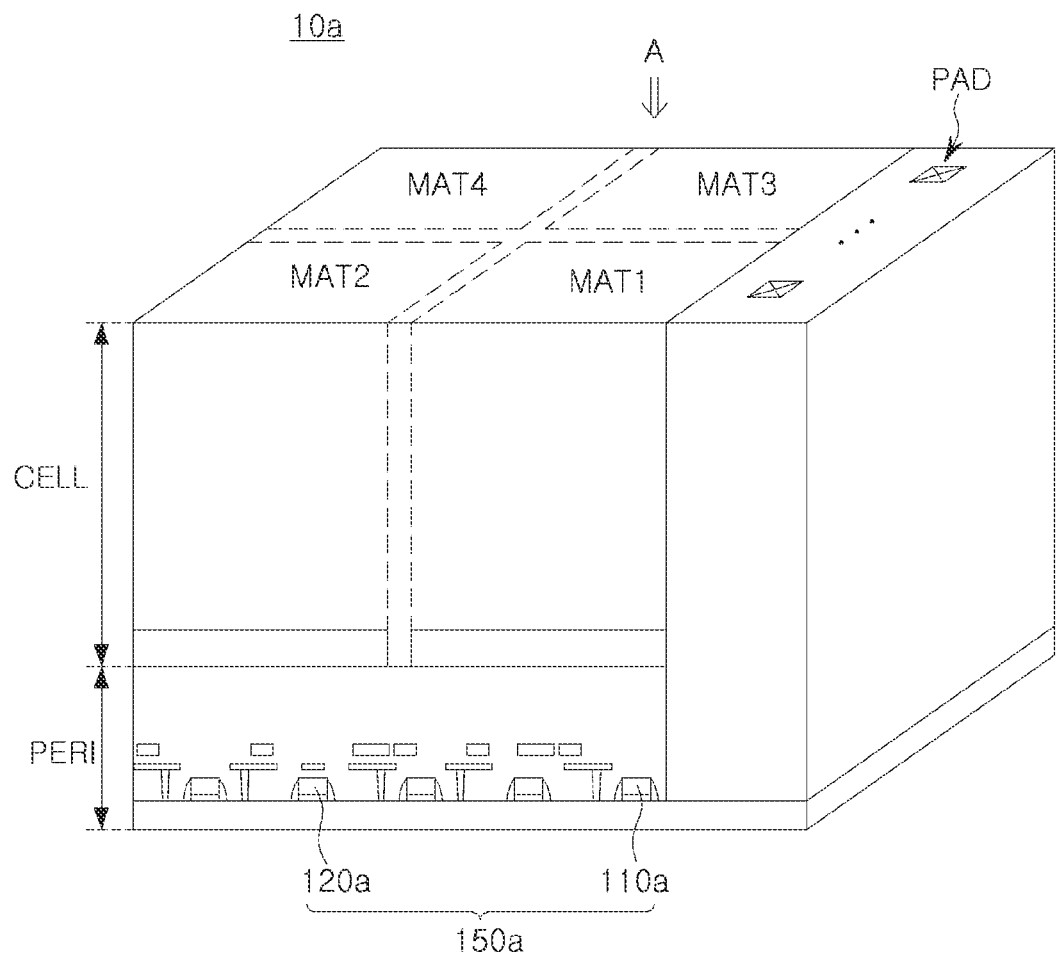
FIGS. 2A and 2B are schematic diagrams of a memory device according to an example embodiment.
Figure 2B:
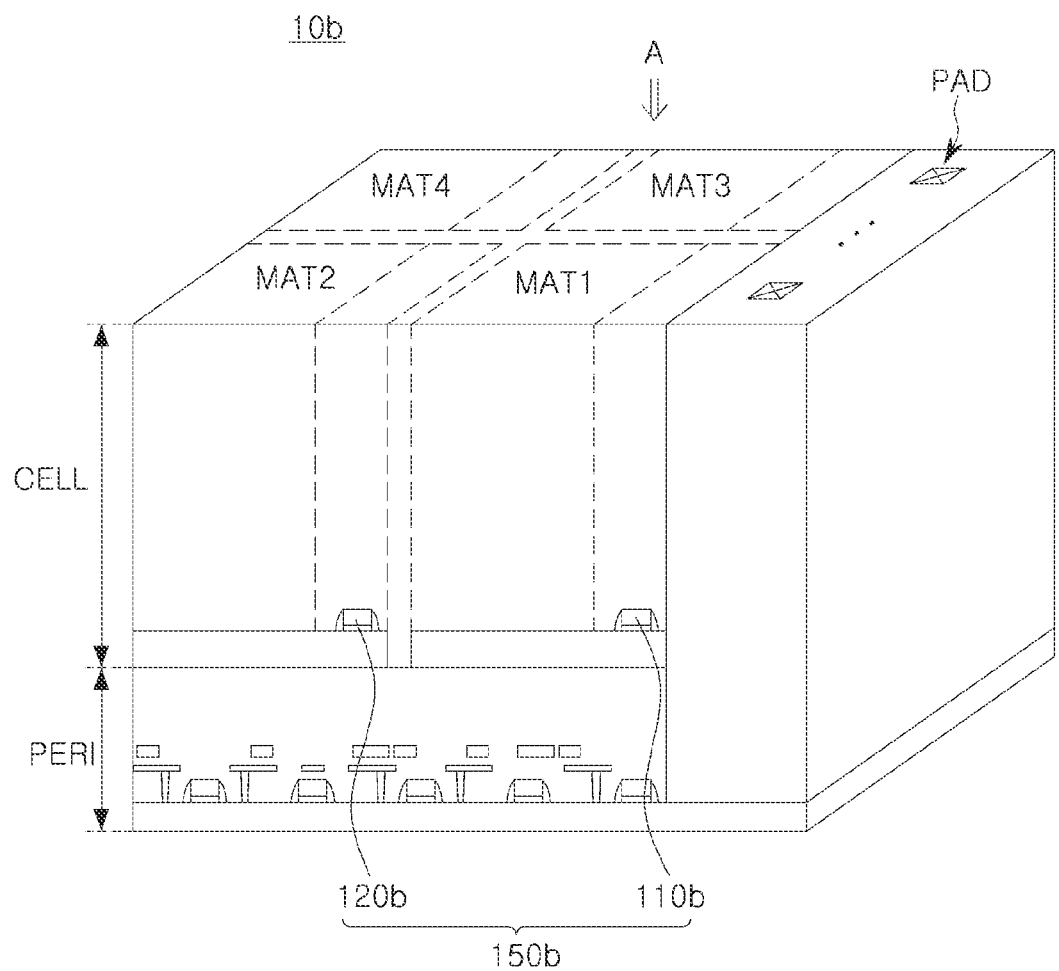

FIGS. 2A and 2B are schematic diagrams of a memory device according to an example embodiment.

Referring to FIGS. 2A and 2B, the memory devices 10*a* and 10*b* according to an example embodiment may include a memory cell area CELL, a peripheral circuit area PERI, and a pad area PAD. Meanwhile, the memory device 10 according to an example embodiment may have a Chip-on-Peri (COP) structure. Accordingly, the peripheral circuit area PERI may be disposed below the memory cell area CELL. However, this is only an example embodiment and the present invention is not limited thereto, and the memory devices 10*a* and 10*b* may have a structure other than a COP structure.

The peripheral circuit area PERI may include a lower substrate and a plurality of transistors formed on the lower substrate. The memory cell area CELL may include an upper substrate and a plurality of MATs MAT1, MAT2, MAT3, and MAT4 formed on the upper substrate. Each of the MATs MAT1, MAT2, MAT3, and MAT4 may include a plurality of memory cells.

In the memory devices 10*a* and 10*b* according to an example embodiment, a plurality of MATs MAT1, MAT2, MAT3, and MAT4 included in the memory cell area CELL may be disposed to be spaced apart from each other. The upper substrates of the memory cell area CELL may also be spaced apart from each other at a location where the plurality of MATs MAT1, MAT2, MAT3, and MAT4 are spaced apart. However, this is only an example embodiment and the present invention is not limited thereto, and the upper substrate may be composed of one connected substrate.

For example, in a space in which the plurality of MATs MAT1, MAT2, MAT3, and MAT4 are spaced apart from each other, a row decoder required for operation of the memory devices 10*a* and 10*b* may be included. However, this is only an example embodiment and the present invention is not limited thereto, and at least some of the other circuits included in the peripheral circuit area PERI may be disposed between the MATs MAT1, MAT2, MAT3, and MAT4.

In the memory devices 10*a* and 10*b* according to the example embodiment, the pad area PAD may be disposed on the side of the memory cell area CELL. The memory devices 10*a* and 10*b* illustrated in FIGS. 2A and 2B are illustrated as having the pad area PAD disposed on the side surface of the peripheral circuit area PERI, but are not limited thereto. The pad area PAD may be disposed on the upper surface of the peripheral circuit area PERI. Also, the pad area PAD may be included in the peripheral circuit area PERI.

The pad area PAD may include a power pad and power wiring for applying an external power voltage to the peripheral circuit area PERI. However, this is only an example embodiment and the present invention is not limited thereto, and the pad area PAD may further include other wires. Also, in the pad area PAD, at least some of other circuits included in the peripheral circuit area PERI may be disposed according to an example embodiment.

The peripheral circuit area PERI may apply an operating voltage to each of the MATs MAT1, MAT2, MAT3, and MAT4 based on the external power voltage applied from the pad area PAD. The operating voltage may be a voltage applied to the plurality of MATs MAT1, MAT2, MAT3, and MAT4 to perform an operation, and may gradually decrease as the operation is performed.

Referring to FIG. 1B, each of the MATs MAT1, MAT2, MAT3, and MAT4 to which an operating voltage is applied may individually perform an operation. For example, an operating voltage and operation applied to each of the plurality of MATs MAT1, MAT2, MAT3, and MAT4 may be different.

The memory devices 10*a* and 10*b* according to the example embodiment illustrated in FIGS. 2A and 2B illustrate a difference in arrangement of the lockout circuits 150*a* and 150*b*.

Referring to FIG. 2A, the lockout circuits 110*a*, 120*a* (e.g., 150*a*) may correspond to each of a plurality of MATs MAT1, MAT2, MAT3, and MAT4. The lockout circuit 150*a* may include a plurality of transistors and wirings for performing a lockout operation. Based on the output of the lockout circuit 150*a*, the peripheral circuit area PERI may lock out operations of the MATs MAT1, MAT2, MAT3, and MAT4 in a specific situation. For example, the peripheral circuit area PERI may stop the operation of the MAT determined to be locked out and perform recovery of the MAT. For example, as the recovery is performed, the operating voltage may be recovered and the operation may be brought into a state in which the operation can be normally performed.

For example, the first lockout circuit 110*a* may correspond to the first MAT MAT1, the second lockout circuit 120*a* may correspond to the second MAT MAT2, a third lockout circuit (not illustrated) may correspond to the third MAT (MAT3), and a fourth lockout circuit (not illustrated) may correspond to the fourth MAT (MAT4). However, this is only an example embodiment and the present invention is not limited thereto, and some of the MATs MAT1, MAT2, MAT3, and MAT4 may not correspond to any lockout circuit or may correspond to a plurality of lockout circuits.

Meanwhile, in the memory device 10*a* according to the example embodiment illustrated in FIG. 2A, the lockout circuit 150*a* may be included in the peripheral circuit area PERI. On the other hand, in the memory device 10*b* according to the example embodiment illustrated in FIG. 2B, the lockout circuit 150*b* may be included in one side of the memory cell area CELL. For example, the lockout circuit 150*b* may be disposed on a corresponding MAT among the plurality of MATs MAT1, MAT2, MAT3, and MAT4, respectively. Depending on the position of the lockout circuits 150*a* and 150*b*, the size and performance of the memory devices 10*a* and 10*b* may differ, but regardless of the position, the lockout circuits 150*a* and 150*b* are used with the memory devices 10*a* and 10*b*.

In addition, in relation to the position of the lockout circuits 150*a* and 150*b*, the lockout circuits 150*a* and 150*b* may be disposed near a wiring to which an external power is applied to minimize noise that may affect the operation of the circuit. For example, the lockout circuits 150*a* and 150*b* may be disposed at a position in which the length of the wiring extending from the power pad to the lockout circuits 150*a* and 150*b* is substantially shortest. However, the present invention is not limited thereto and the lockout circuits 150*a* and 150*b* of the memory devices 10*a* and 10*b* according to an example embodiment may be disposed in various positions as necessary.

Meanwhile, the lockout circuits 150*a* and 150*b* may individually determine whether to lock out during the operation of the plurality of MATs MAT1, MAT2, MAT3, and MAT4. As an example, the peripheral circuit area (PERI) may individually stop the operation and perform recovery based on the output signal of the lockout circuits 150*a*, 150*b* when the operating voltage of each of the plurality of MATs (MAT1, MAT2, MAT3, MAT4) is not sufficient to continue the operation.

The memory devices 10*a* and 10*b* according to an example embodiment may be defined as including a plurality of memory areas and pad areas PAD. As an example, the first memory area may include a first memory cell array having a plurality of first memory cells and a first peripheral circuit that controls the first memory cells and is disposed below the first memory cell array. For example, the first memory cell array may be a first MAT and the first peripheral circuit may be at least a part of the peripheral circuit area PERI.

A second memory area, including a second memory cell array having a plurality of second memory cells and a second peripheral circuit that controls the second memory cells and is disposed below the second memory cell array, may be included in a single semiconductor chip with the first memory area to share the pad area PAD.

Accordingly, the lockout circuits 150*a* and 150*b* may be defined as being included in a corresponding memory area, respectively. The plurality of memory areas may individually perform operations using operating voltages based on external power applied from the pad area PAD. Meanwhile, the lockout circuits 150*a* and 150*b* may individually determine whether to lockout during an operation of the memory area. The structure and operation of the lockout circuit 150*a* 150*b* according to the example embodiments will be described later.

Figure 3:
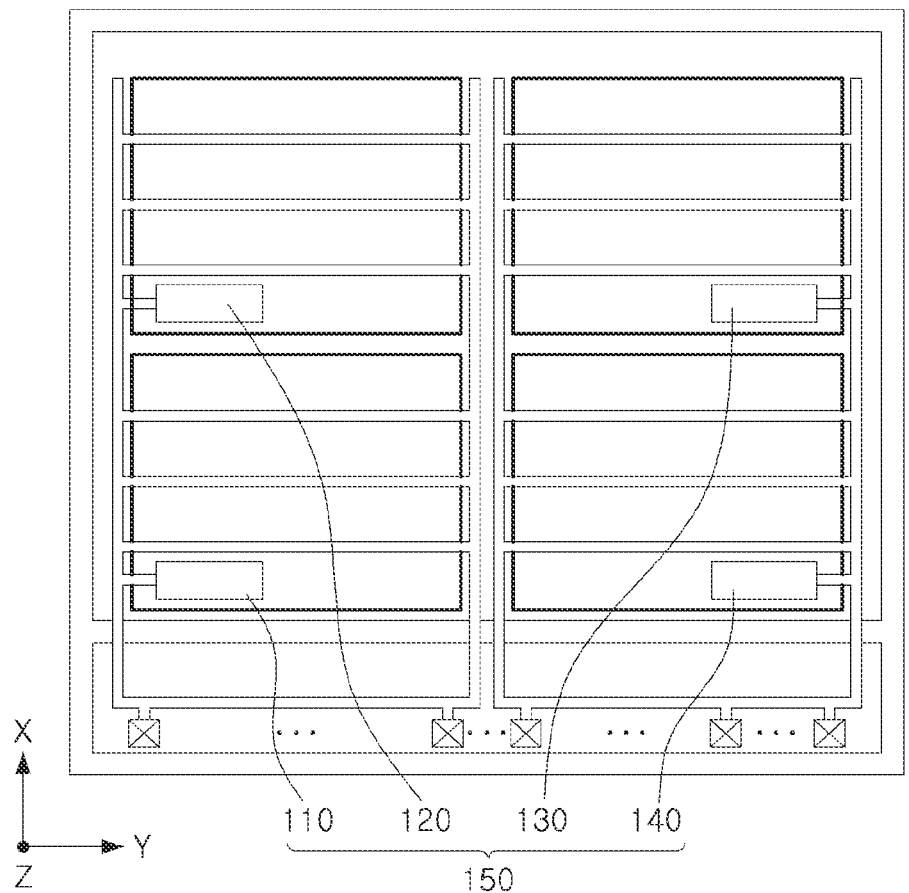
FIG. 3 is a schematic plan view of a memory device according to an example embodiment.

FIG. 3 is a schematic plan view of a memory device according to an example embodiment.

The plan view of the memory device 10 illustrated in FIG. 3 may be a view of the memory devices 10*a* and 10*b* illustrated in FIGS. 2A and 2B from a direction A. The external power voltage applied to the pad area PAD may be applied to the plurality of MATs MAT1, MAT2, MAT3, and MAT4 through power wirings included in the pad area PAD and the peripheral circuit area PERI. As an example, a wiring included in the pad area PAD may extend in a first direction (y direction) and a wiring included in the peripheral circuit area PERI is a second direction (x direction) perpendicular to the first direction. However, this is only an example embodiment and the present invention is not limited thereto and the wiring to which the power voltage is applied may be disposed in various manners according to example embodiments.

As described above, the lockout circuits 110, 120, 130, 140 (e.g., 150) for determining whether to lock out the plurality of MATs MAT1, MAT2, MAT3, MAT4 can be placed in each. For example, the lockout circuit 150 may be disposed near a wiring to which an external power is applied to minimize noise that may affect the operation of the circuit. For example, the lockout circuit 150 may be disposed at a position where the length of each wire extending from the power pad to the lockout circuit 150 is substantially shortest. However, this is only an example embodiment and the present invention is not limited thereto, and the lockout circuit 150 may be disposed in various positions according to example embodiments.

In the memory device 10 according to an example embodiment, a voltage applied to the plurality of MATs MAT1, MAT2, MAT3, and MAT4 may be an operating voltage in which a voltage drop occurs from an external power supply voltage. For example, the external power supply voltage may decrease by an amount of a first voltage drop to become an operating voltage for performing the operation of the plurality of MATs MAT1, MAT2, MAT3, and MAT4. The first voltage drop may mean a voltage drop until an external power supply voltage is applied to the plurality of MATs MAT1, MAT2, MAT3, and MAT4 through the pad area PAD and the peripheral circuit area PERI.

The operating voltage having the first voltage drop may be applied to a plurality of MATs MAT1, MAT2, MAT3, and MAT4. The plurality of MATs MAT1, MAT2, MAT3, and MAT4 may individually perform an operation using the applied operating voltage. For example, the operation of the plurality of MATs (MAT1, MAT2, MAT3, MAT4) may be any one of read, program, and erase operations, and the plurality of MATs (MAT1, MAT2, MAT3, MAT4) may perform different operations.

In the memory device 10 according to an example embodiment, the applied operating voltages of the MATs MAT1, MAT2, MAT3, and MAT4 may include input voltages input to selected memory cells, pass voltages input to non-selected memory cells, and bias voltages input to a string select line, a ground select line, a common source line, and the like. For example, the input voltage input to the selected memory cell may include a program voltage, a read voltage, and the like according to the operation of the plurality of MATs MAT1, MAT2, MAT3, and MAT4.

While the plurality of MATs MAT1, MAT2, MAT3, and MAT4 perform an operation, the operating voltage may gradually decrease. The intensity of the voltage decreases during the operation may be a value corresponding to the magnitude of a second voltage drop. The lockout circuit 150 may determine whether to lock out the plurality of MATs MAT1, MAT2, MAT3, and MAT4 by comparing the lockout voltage with the operating voltage that decreases during the operation. The lockout voltage may be a predetermined voltage value that is a reference for normal operation of the MATs MAT1, MAT2, MAT3, and MAT4.

However, this is only an example embodiment and the present invention is not limited thereto, and according to the example embodiment, the lockout circuit 150 may determine whether to lockout during the second voltage drop as well as during the first voltage drop. The characteristics of the first voltage drop and the second voltage drop will be described later.

Figure 4:
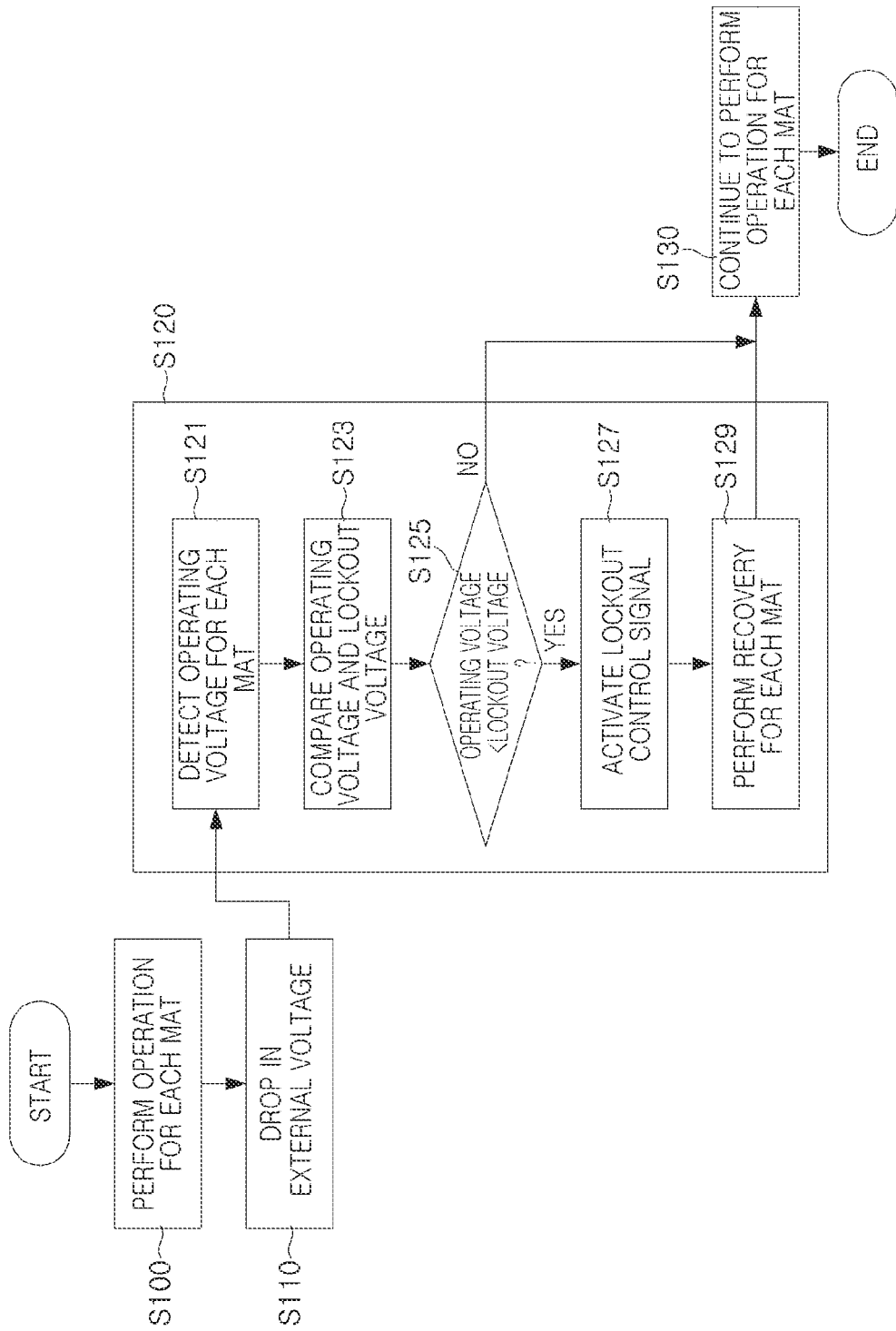
FIG. 4 is a flowchart illustrating a lockout operation for each MAT of a memory device according to an example embodiment.

FIG. 4 is a flowchart illustrating a lockout operation for each MAT of a memory device according to an example embodiment.

Referring to FIG. 4, the memory device according to an example embodiment may perform an operation for each MAT (S100). The operation of the MAT may be one of a read operation, a program operation, and an erase operation, and each of the MATs may perform different operations. Meanwhile, while each MAT is performing an operation, a situation in which it is difficult for each MAT to normally perform an operation may occur as an external voltage drop occurs (S110).

The lockout circuits corresponding to each MAT may individually determine whether to lockout with respect to S110 and allow the peripheral circuit area to perform the lockout operation (S120). However, this is only an example embodiment and the present invention is not limited thereto, and the lockout circuits may operate to determine whether to lockout due to an internal voltage drop or the like even when an external voltage drop does not occur.

The lockout circuit may detect an operating voltage for each MAT (S121) and compare the detected operating voltage with the lockout voltage (S123). For example, the detected operating voltage may continuously decrease as the operation is performed on the MAT. The lockout circuit may individually generate a lockout control signal according to the level of the operating voltage. In this case, when the operating voltage is lower than the lockout voltage, the lockout circuit may activate the lockout control signal to cause the peripheral circuit area to perform the lockout operation. On the other hand, when the operating voltage is greater than the lockout voltage, the peripheral circuit area may not perform the lockout operation (S125).

In order to perform the lockout operation in the peripheral circuit area, the lockout circuit may activate a lockout control signal corresponding to the MAT (S127). Accordingly, the peripheral circuit area corresponding to the MAT where the activated lockout control signal is detected may stop the operation of the MAT. When the operation of the corresponding MAT is stopped, the peripheral circuit area may perform recovery to perform the operation again (S129). For example, by performing recovery, an operation that has been performed may return to an initial state, and an operating voltage may increase to a range in which the operation can be performed normally. However, this is only an example embodiment, and the present invention is not limited thereto, and a subject performing the lockout operation and a process of the operation may be different according to example embodiments.

When the lockout operation is not performed in S125 and when the lockout operation is performed and recovery is completed through the steps of S127-S129, each MAT may perform the operation again (S130). Meanwhile, operations S100 to S130 of the memory device according to the example embodiment illustrated in FIG. 4 may be performed individually for each MAT.

Figure 5A:
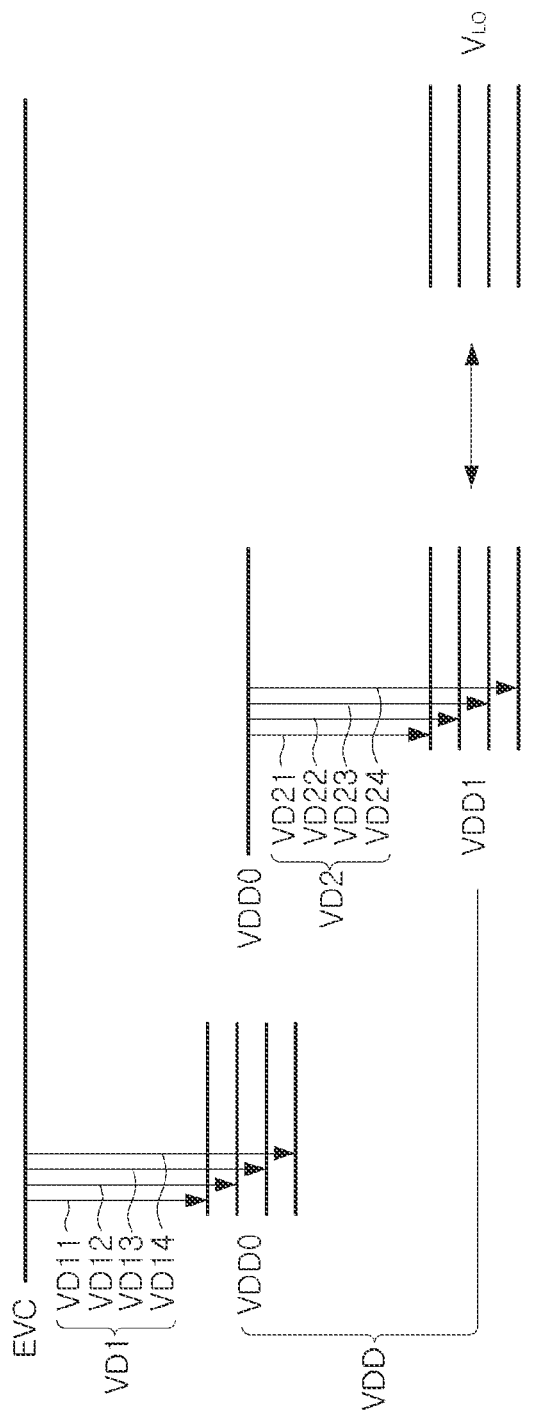
FIGS. 5A and 5B are diagrams illustrating a voltage change according to a lockout operation of a memory device according to an example embodiment.
Figure 5B:
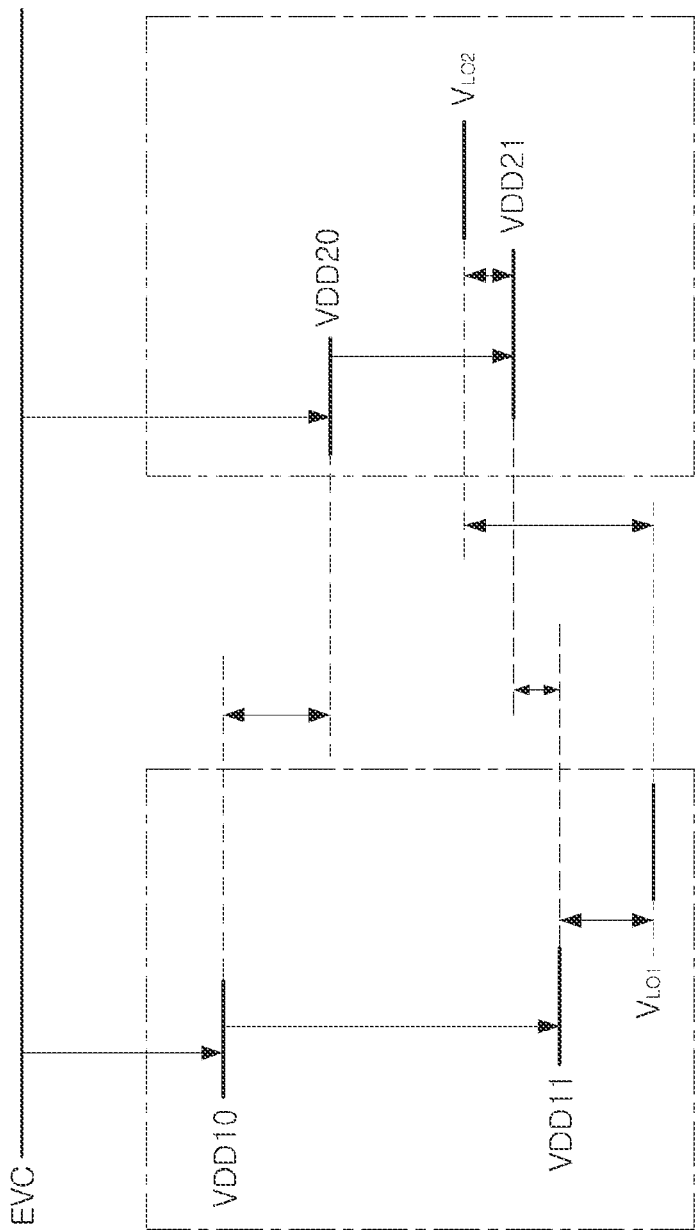

FIGS. 5A and 5B are diagrams illustrating a voltage change according to a lockout operation of a memory device according to an example embodiment.

Referring to FIG. 5A, a memory device according to an example embodiment may receive an external power voltage EVC and may apply an operating voltage VDD0 to each of the MATs to be used for the operation of the memory device based on the external power voltage EVC. The operating voltage VDD0 before the start of the operation of the memory device may be a value obtained by decreasing the voltage by the amount of the first voltage drop VD11, VD12, VD13, VD14 (VD1) from the external power voltage EVC.

For example, the first voltage drop VD1 may be determined according to a length of a power wiring connecting each of the lockout circuits to a power pad receiving external power. For example, according to the position of the lockout circuit, the length of the power wiring may correspond to the length of the power wiring connecting the power pad and each MAT. However, this is only an example, the present invention is not limited thereto, and the magnitude of the first voltage drop VD1 may be determined by various other factors.

The plurality of MATs may be disposed at different distances from the pad area. Accordingly, the magnitude of the first voltage drop VD1 may be different in at least some of the MATs and at least some of the MATs may have different operating voltages VDD0. For example, the first voltage drop VD11 in the first MAT disposed close to the pad area may have a value smaller than the first voltage drop VD14 in the fourth MAT disposed relatively far from the pad area.

Meanwhile, the operating voltage VDD0 may decrease by the second voltage drop VD2 (e.g., VD21, VD22, VD23, VD24) while the plurality of MATs perform an operation. For example, the second voltage drop VD2 may be determined based on an operation performed by the plurality of MATs. For example, while a program operation is being performed, a greater voltage drop may occur than while a read or erase operation is being performed. However, this is only an example and the present invention is not limited thereto.

The plurality of MATs can simultaneously perform different operations. For example, while the first MAT performs a read operation, the third MAT may perform a program operation. As an example, when the operating voltage VDD0 is applied, the magnitude of the second voltage drop VD21 that decreases while performing the operation on the first MAT may be smaller than the second voltage drop VD23 that decreases while performing the operation on the third MAT.

When the plurality of MATs finish their operation, they may have an end-time operating voltage VDD1 that is reduced by the amount of the second voltage drop VD2 from the first operating voltage VDD0. In other words, the plurality of MATs may have a voltage of VDD1 or more and VDD0 or lower during operation. Meanwhile, when the external power supply voltage EVC or the operating voltage VDD is lower than a predetermined voltage required for operation of the memory device, it may be difficult to ensure normal operation of the memory device. Accordingly, the lockout circuit may determine whether to lockout and causes the peripheral circuit area to perform the lockout operation, thereby supporting a stable operation of the memory device.

The lockout circuit may determine whether to lockout by comparing the operating voltage VDD with the lockout voltage $V_{LO}$. The operating voltage VDD to be compared may be a value greater than or equal to VDD1 and lower than or equal to VDD0. As described above, the operating voltage VDD may vary depending on the arrangement of the lockout circuit and the operation performed on the MAT. In this case, the lockout voltage applied to at least some of the plurality of MATs may be predetermined voltages different from each other. The lockout voltage may be determined according to an operation performed on a plurality of MATs. However, this is only an example embodiment and the present invention is not limited thereto. According to example embodiments, the lockout voltage may be determined by factors other than the operation of the MAT, and may be the same voltage.

FIG. 5B may be a diagram for describing a comparison of an operation to be performed and a voltage drop in any two MATs having different distances from the pad area. For example, the two MATs may be a first and a second MAT, respectively, and the first MAT may be a MAT having a relatively close distance from the pad area and may perform a program operation. On the other hand, the second MAT may be a MAT having a relatively far distance from the pad area and may perform a read operation.

In the memory device according to an example embodiment, the applied external power voltage EVC may drop by a different magnitude of the first voltage drop until the voltage is applied to the first and second MATs in the form of operating voltages VDD10 and VDD20. For example, the first voltage drop of the voltage applied to the second MAT disposed far from the pad area may be greater than the first voltage drop of the voltage applied to the first MAT, and therefore, the operating voltage VDD10 applied to the first MAT to perform the operation may be greater than the operating voltage VDD20 applied to the second MAT.

Meanwhile, in relation to the second voltage drop that occurs due to the operation of the first and second MATs, the magnitude of the second voltage drop of the voltage applied to the first MAT performing the program operation may be larger than the second voltage drop of the voltage applied to the second MAT performing the read operation. Accordingly, the operating voltage VDD11 applied to the first MAT after the operation is finished may be less than the operating voltage VDD21 applied to the second MAT after the operation is finished. However, this is only an example embodiment and the present invention is not limited thereto, and according to the example embodiment, the sizes of the operating voltages VDD10 and VDD11 of the first MAT and the operating voltages VDD20 and VDD21 of the second MAT may be different from those described above.

The first lockout circuit corresponding to the first MAT may determine whether the first MAT is locked out by comparing the operating voltages VDD10 and VDD11 of the first MAT with the first lockout voltage $V_{LO1}$. Meanwhile, the second lockout circuit corresponding to the second MAT may determine whether to lockout the second MAT by comparing the operating voltages VDD20 and VDD21 of the second MAT with the second lockout voltage $V_{LO2}$. The first and second lockout voltages $V_{LO1}$ and $V_{LO2}$ may be predetermined values different from each other. For example, the first lockout voltage $V_{LO1}$ corresponding to the first MAT performing the program operation may be smaller than the second lockout voltage $V_{LO2}$ corresponding to the second MAT performing the read operation. However, this is only an example embodiment and may not be limited.

In the memory device according to an example embodiment, the first lockout circuit may compare the operating voltages VDD10 and VDD11, which decrease from VDD10 to VDD11 as a program operation is performed in the first MAT, with the first lockout voltage $V_{LO1}$. For example, the operating voltages VDD10 and VDD11 of the first MAT may not drop below the first lockout voltage $V_{LO1}$. In this case, the lockout control signal generated by the first lockout circuit is not activated, and the first MAT may continue to operate normally.

Meanwhile, the second lockout circuit may compare the operating voltages VDD20 and VDD21 that decrease from VDD20 to VDD21 as the read operation is performed in the second MAT with the second lockout voltage $V_{LO2}$. For example, the operating voltages VDD20 and VDD21 of the second MAT may drop below the second lockout voltage $V_{LO2}$ during operation. The lockout control signal generated by the second lockout circuit may be activated when the operating voltages VDD20 and VDD21 of the second MAT drop below the second lockout voltage $V_{LO2}$. Accordingly, the peripheral circuit area may stop the operation of the second MAT and perform recovery so that the operation may be performed again.

Figure 6:
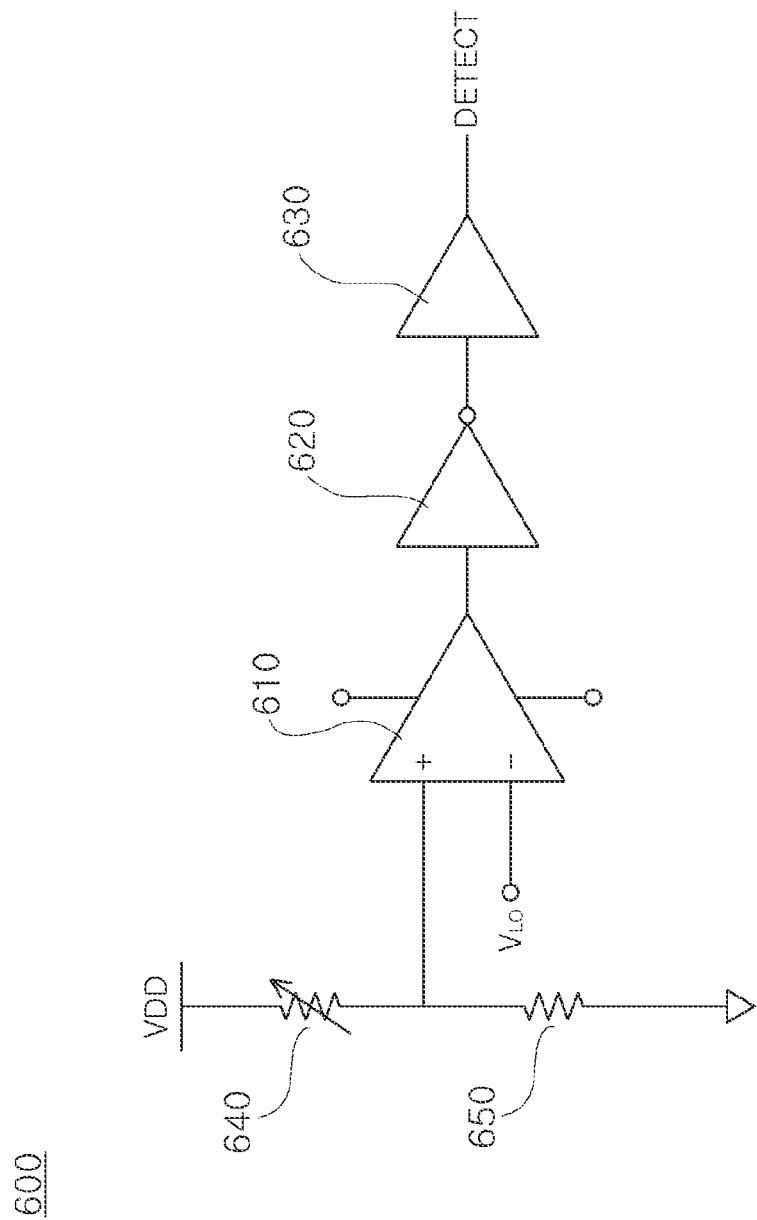
FIG. 6 is a circuit diagram of a lockout circuit included in a memory device according to an example embodiment.

FIG. 6 is a circuit diagram of a lockout circuit included in a memory device according to an example embodiment.

Referring to FIG. 6, a lockout circuit 600 included in a memory device according to an example embodiment may include a comparator 610, an inverter 620, a buffer 630, a variable resistor 640, and a fixed resistor 650. However, this is only an example embodiment and the present invention is not limited thereto, and devices such as a filter may be further included if necessary.

As described above, the lockout circuit 600 may generate a lockout signal and detect whether the operating voltage has dropped below a predetermined lockout voltage $V_{LO}$. When the operating voltage drops below the predetermined lockout voltage $V_{LO}$, each lockout circuit 600 may selectively activate the generated lockout signal.

For example, in a process of applying an operating voltage to the MAT, the lockout circuit 600 may generate an activated lockout control signal when the operating voltage drops below a predetermined level due to a voltage drop due to various causes. Memory cells included in the MAT may stop an operation performed by an activated lockout control signal and perform recovery.

In addition, the lockout circuit 600 may determine whether to lockout in consideration of a voltage drop while the MAT is operating. The lockout circuit 600 may compare the reduced operating voltage while the MAT is operating with the lockout voltage $V_{LO}$. Meanwhile, the lockout circuit 600 may include the variable resistor 640 for adjusting an operating voltage according to an operation of a corresponding MAT. In other words, the operating voltage considering the voltage drop may be implemented by the variable resistor 640 included in the lockout circuit 600. However, this is only an example embodiment and the present invention is not limited thereto, and may be implemented in various ways according to example embodiments.

The lockout circuit 600 included in the memory device according to the example embodiment may be applied to various types of semiconductor memory devices and integrated circuits as well as flash memories. The lockout circuit 600 is not limited to the arrangement illustrated in FIGS. 2A and 2B and the circuit configuration illustrated in FIG. 6, but may be formed of other arrangements and/or circuit configurations performing similar operations.

Figure 7:
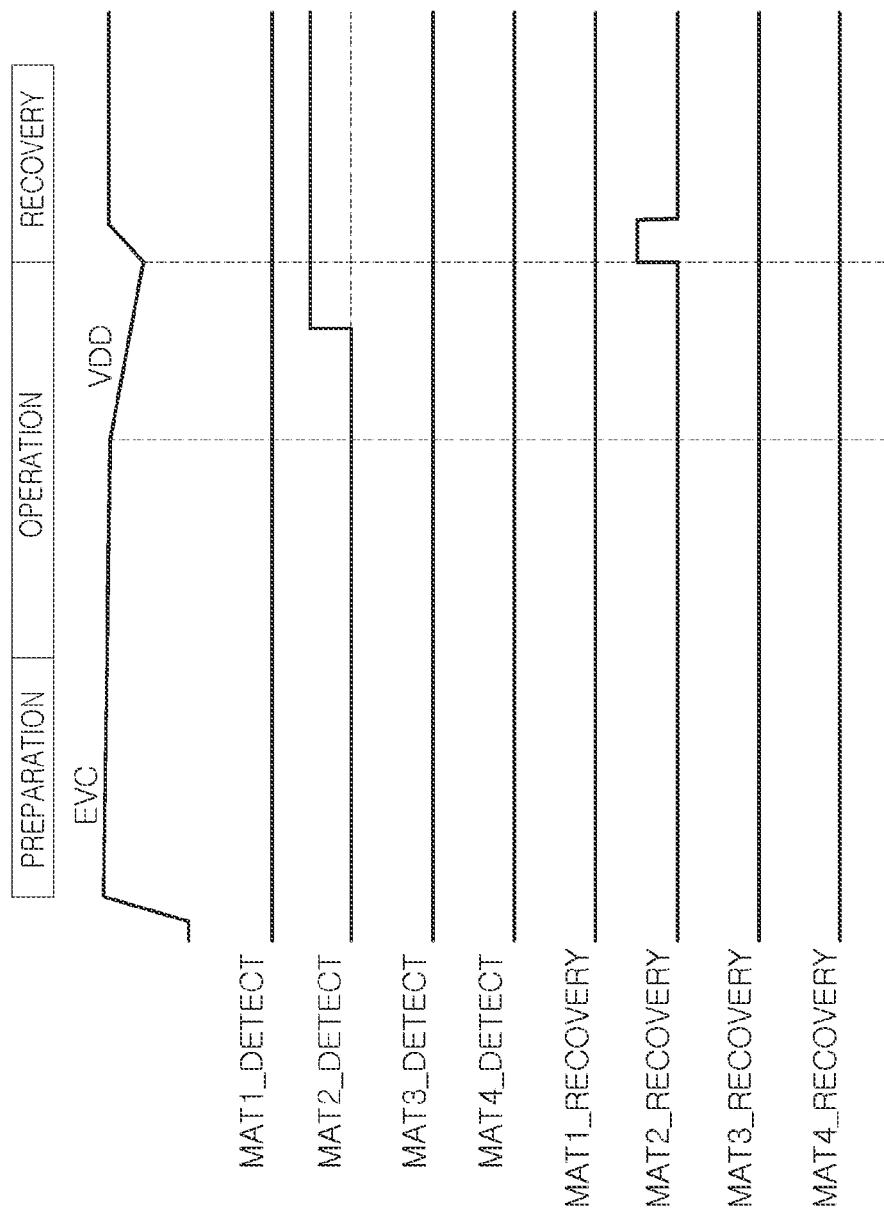
FIGS. 7 and 8 are diagrams illustrating a lockout operation of a memory device according to example embodiments.
Figure 8:
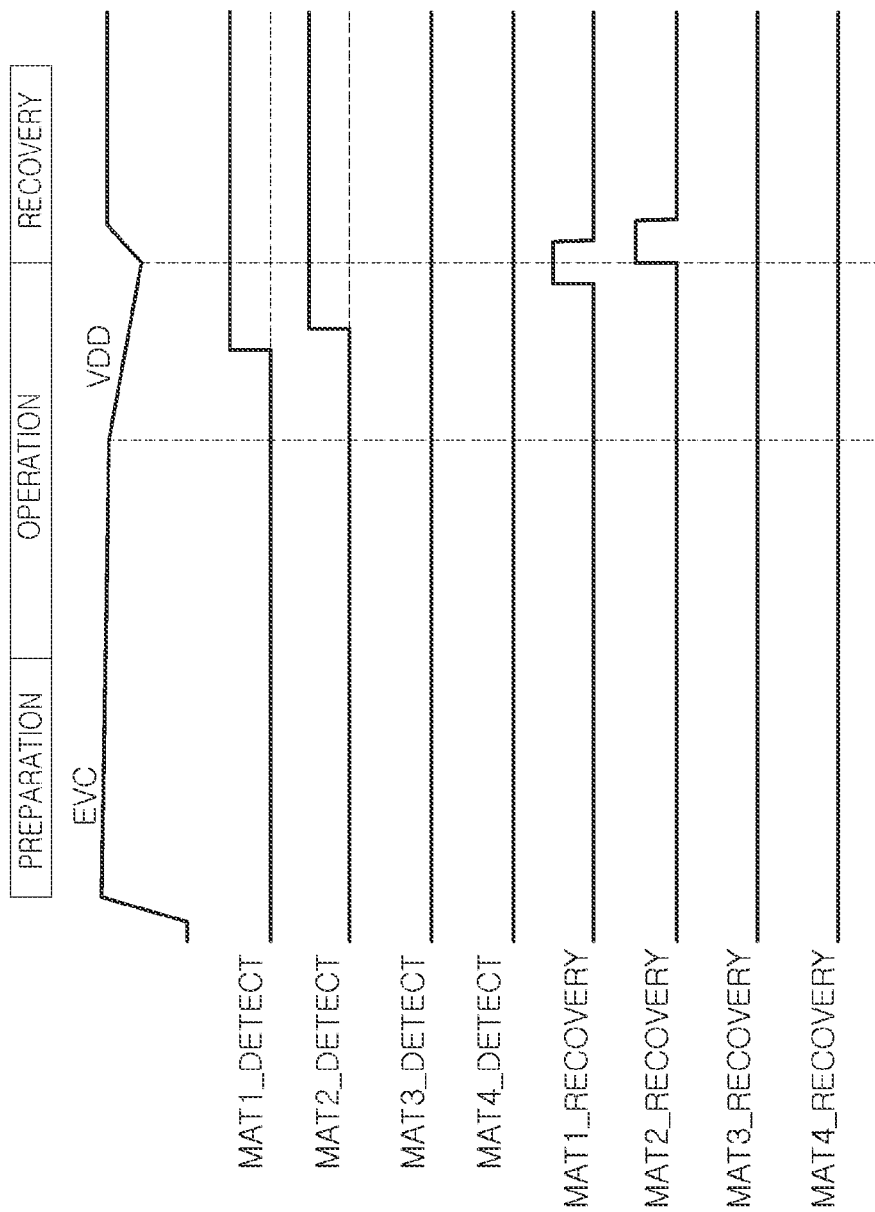

FIGS. 7 and 8 are diagrams illustrating a lockout operation of a memory device according to example embodiments.

Referring to FIG. 7, a lockout operation may be performed while a plurality of MATs MAT1, MAT2, MAT3, and MAT4 of a memory device, according to an example embodiment, respectively perform separate operations. For example, when an operating voltage VDD lower than the lockout voltage is detected in one MAT, the peripheral circuit area corresponding to the MAT stops only the operation of the MAT, and recovery may be performed. Referring to the drawing illustrated in FIG. 7, the one MAT may be a second MAT MAT2.

The external power voltage EVC applied to the memory device according to the example embodiment may be applied in a preparation phase to the plurality of MATs MAT1, MAT2, MAT3, and MAT4 in the form of an operating voltage VDD through a first voltage drop. The applied operating voltage VDD may be dropped by a second voltage drop while the plurality of MATs MAT1, MAT2, MAT3, and MAT4 are performing an operation in an operation phase. For example, the second voltage drop may be determined according to the operation of the plurality of MATs MAT1, MAT2, MAT3, and MAT4.

As an example, during the voltage drop by the second voltage drop, the lockout circuit 600 may activate a second detection signal MAT2_DETECT corresponding to the second MAT MAT2 where the operating voltage VDD drops below the lockout voltage. For example, the second detection signal MAT2_DETECT may be a second lockout control signal. In response to the activated second detection signal MAT2_DETECT, the peripheral circuit area corresponding to the second MAT MAT2 may stop the operation of the second MAT MAT2 and perform recovery in a recovery phase. During recovery of the second MAT MAT2, the second recovery signal MAT2_RECOVERY may be activated.

Meanwhile, after the second detection signal MAT2_DETECT is activated, it may take a predetermined time before the second recovery signal MAT2_RECOVERY is activated. However, the shape of the signal illustrated in FIG. 7 is only an example embodiment and the present invention is not limited, and a predetermined time may be different according to example embodiments. In this example, the first detection signal MAT1_DETECT, third detection signal MAT3_DETECT, and fourth detection signal MAT4_DETECT are not activated because no voltage abnormality is detected with their respective first, third, and fourth MATs MAST1, MAT3, and MAT4 and, accordingly, the first recovery signal MAT1_RECOVERY, third recovery signal MAT3_RECOVERY, and fourth recovery signal MAT4_RECOVERY are not activated.

Referring to FIG. 8, a lockout operation may be performed while a plurality of MATs MAT1, MAT2, MAT3, and MAT4 of a memory device according to an example embodiment respectively perform separate operations. For example, when an operating voltage VDD lower than or equal to the lockout voltage is detected in each of two MATs, operations of the detected two MATs are stopped and recovery may be performed. Referring to the drawing illustrated in FIG. 8, the two MATs may be a first MAT and a second MAT.

In the memory device according to the example embodiments, the operation of the plurality of MATs MAT1, MAT2, MAT3, and MAT4 may be similar to that of the memory device illustrated in FIG. 7. However, unlike the memory device illustrated in FIG. 7, when an operating voltage VDD lower than the lockout voltage is detected in two MATs, the lockout operation may be individually performed on each MAT.

For example, the second MAT may perform a lockout operation in the same way as the memory device illustrated in FIG. 7. Meanwhile, separate from that, during the second voltage drop, the lockout circuit 600 may activate a first detection signal MAT1_DETECT corresponding to the first MAT MAT1 in which the operating voltage VDD drops below the lockout voltage. For example, the first detection signal MAT1_DETECT may be a first lockout control signal. In response to the activated first detection signal MAT1_DETECT, the peripheral circuit area corresponding to the first MAT MAT1 may stop the operation of the first MAT MAT1 and perform recovery. During recovery of the first MAT MAT1, the first recovery signal MAT1_RECOVERY may be activated.

Meanwhile, since the first MAT MAT1 and the second MAT MAT2 may perform different operations, the timing at which the first detection signal MAT1_DETECT and the second detection signal MAT2_DETECT are activated may be different from each other. For example, the operating voltage VDD and the lockout voltage of the first MAT MAT1 and the second MAT MAT2 may be different from each other. However, this is only an example embodiment and the present invention is not limited thereto, and at least some of the operating voltage VDD and the lockout voltage may be the same according to example embodiments.

Figure 9:
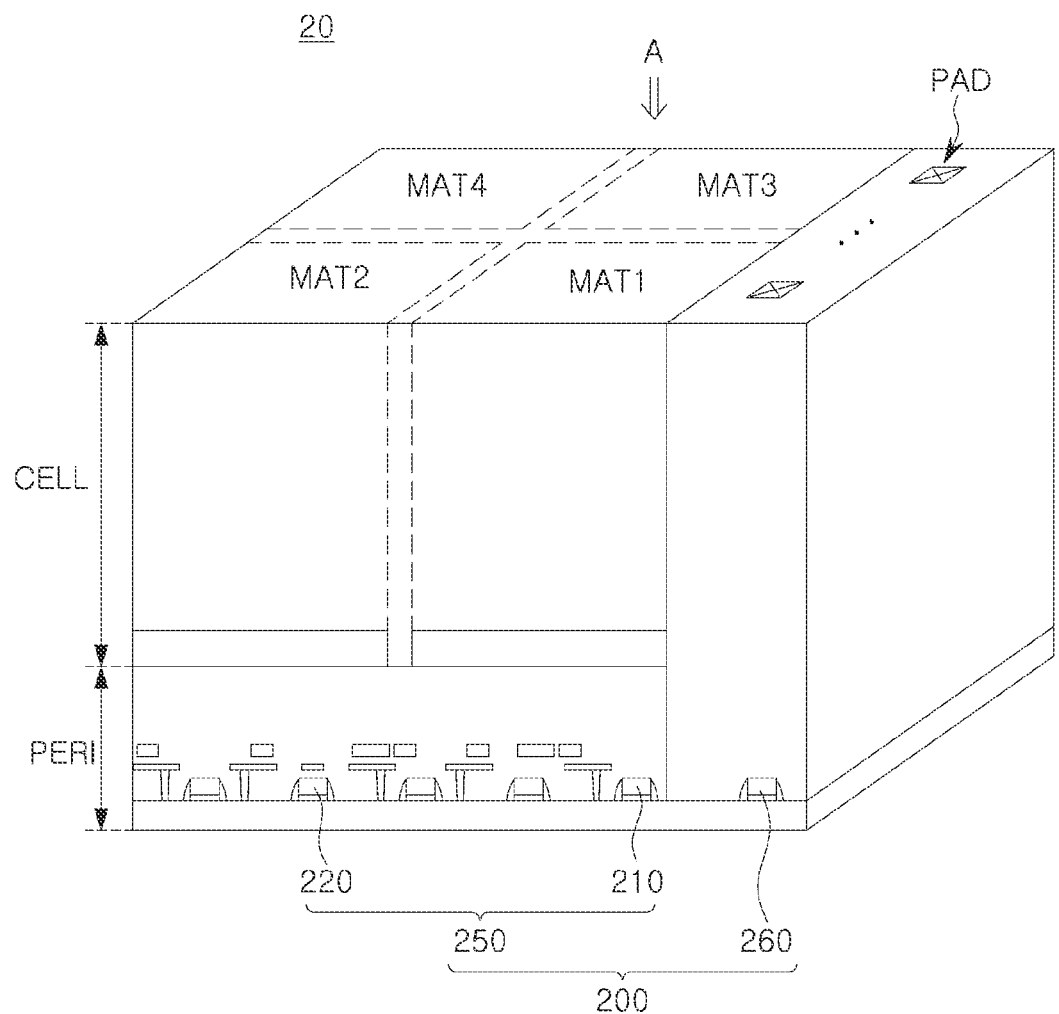
FIG. 9 is a schematic diagram of a memory device according to an example embodiment.

FIG. 9 is a schematic diagram of a memory device according to an example embodiment.

Referring to FIG. 9, in the configuration of the memory device 10a illustrated in FIG. 2A, a memory device 20 according to an example embodiment may further include a global lockout circuit 260 disposed in a pad area PAD. The global lockout circuit 260 may be distinguished from the local lockout circuits 210, 220 (e.g. 250) corresponding to the plurality of MATs MAT1, MAT2, MAT3, and MAT4 according to the arrangement position. For example, the global lockout circuit 260 may have the same structure as the local lockout circuit 250.

Meanwhile, when the peripheral circuit area PERI is defined as being disposed below the pad area PAD, the global lockout circuit 260 may be disposed in the peripheral circuit area PERI under the pad area PAD. However, this is only an embodiment and the present invention is not limited thereto, and the global lockout circuit 260 may be disposed at various locations that can determine whether to lock out a plurality of MATs (MAT1, MAT2, MAT3, MAT4) according to the example embodiment.

The global lockout circuit 260 may generate a global lockout control signal according to a level of a global operating voltage applied to the peripheral circuit area PERI. The global lockout control signal may be distinguished from the local lockout control signal generated by the local lockout circuit 250. The global lockout circuit 260 may determine whether to lock out all of the MATs MAT1, MAT2, MAT3, and MAT4 from the generated global lockout control signal.

The global operating voltage may be an operating voltage of a memory device for operating the entire plurality of MATs MAT1, MAT2, MAT3, MAT4 by receiving an external power voltage. The global operating voltage may be different from the operating voltage of each of the plurality of MATs. For example, the global operating voltage may have a value greater than the operating voltage of each of the plurality of MATs. However, this is only an example and may not be limited.

For example, the reference voltage compared to the global operating voltage in the global lockout circuit 260 may be a global lockout voltage. The global lockout voltage may be a reference voltage for normal operation of all of the plurality of MATs MAT1, MAT2, MAT3, and MAT4, and may have a value different from the local lockout voltage.

The global lockout circuit 260 may activate a global lockout control signal when the global operating voltage is lower than the global lockout voltage. When the global lockout control signal is activated, the peripheral circuit area PERI may stop the operation of all of the MATs MAT1, MAT2, MAT3, and MAT4 and perform recovery. In other words, when the global lockout control signal is activated, the lockout operation may be performed on all of the MATs MAT1, MAT2, MAT3, and MAT4 regardless of whether the local lockout control signal is activated.

On the other hand, the peripheral circuit area (PERI) may include a circuit that performs a lockout operation for all of the MATs (MAT1, MAT2, MAT3, MAT4) according to the global lockout control signal generated from the global lockout circuit 260. However, this is only an embodiment and the present invention is not limited thereto and the lockout operation of the entire plurality of MATs (MAT1, MAT2, MAT3, MAT4) may be performed by a peripheral circuit area corresponding to each of the plurality of MATs (MAT1, MAT2, MAT3, MAT4). It may also be performed by circuits included in (PERI).

Figure 10:
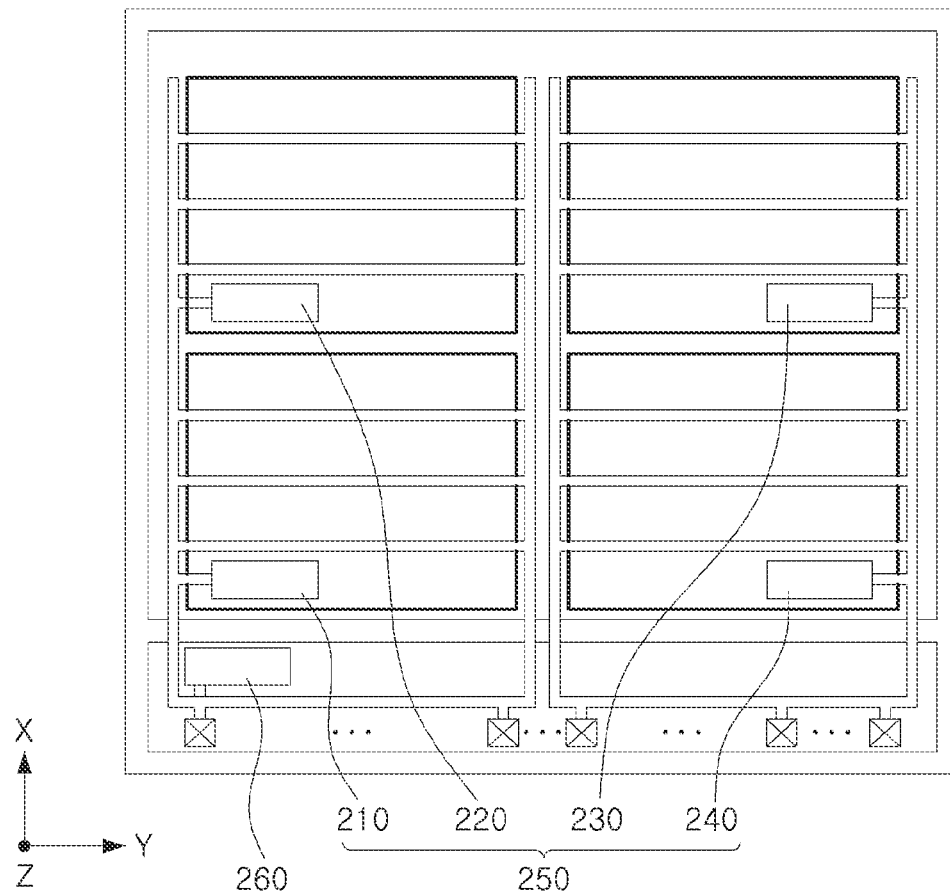
FIG. 10 is a schematic plan view of a memory device according to an example embodiment.

FIG. 10 is a schematic plan view of a memory device according to an example embodiment.

A plan view of the memory device 20 illustrated in FIG. 10 may be a view of the memory device 20 illustrated in FIG. 9 from a direction A. The wiring to which the external power voltage is applied and the arrangement of the local lockout circuits 210, 220, 230, and 240 (250) may be similar to the memory device 10 according to the example embodiment illustrated in FIG. 3.

Referring to FIG. 10, the memory device 20 according to an example embodiment may further include a global lockout circuit 260 included in the pad area PAD. For example, the global lockout circuit 260 may be disposed near a wiring to which an external power is applied to minimize noise that may affect the operation of the circuit. For example, the global lockout circuit 260 may be disposed at a position where the length of the wiring extending from the power pad to the global lockout circuit 260 is substantially shortest. However, the present invention is not limited thereto, and the global lockout circuit 260 of the memory device 20 according to an example embodiment may be disposed in various positions as necessary.

In the memory device 20 according to an example embodiment, a target to be compared with the global lockout voltage in the global lockout circuit 260 may be a global operating voltage. The global operating voltage may be a voltage in which a voltage drop is achieved by a predetermined amount from the applied external power voltage.

As described above, unlike the local lockout circuit 250 corresponding to each of the plurality of MATs MAT1, MAT2, MAT3, and MAT4, the global lockout circuit 260 may be a circuit corresponding to the entire memory device. Therefore, regardless of the operation of the plurality of MATs (MAT1, MAT2, MAT3, MAT4), the global lockout circuit 260 compares the external power supply voltage and the global lockout voltage to determine whether to lock out all of the plurality of MATs (MAT1, MAT2, MAT3, MAT4). The global lockout voltage may be a predetermined voltage value for the memory device 20 including the plurality of MATs MAT1, MAT2, MAT3, and MAT4 to operate normally.

The global lockout circuit 260 operates in conjunction with the local lockout circuit 250, so that when a sudden power down occurs, the memory device 20 does not need to individually determine whether to lockout each of the plurality of MATs (MAT1, MAT2, MAT3, MAT4). Accordingly, the global lockout circuit 260 within the peripheral circuit area PERI may stop the operation of all of the plurality of MATs MAT1, MAT2, MAT3, and MAT4 at once and perform recovery as a whole.

Figure 11:
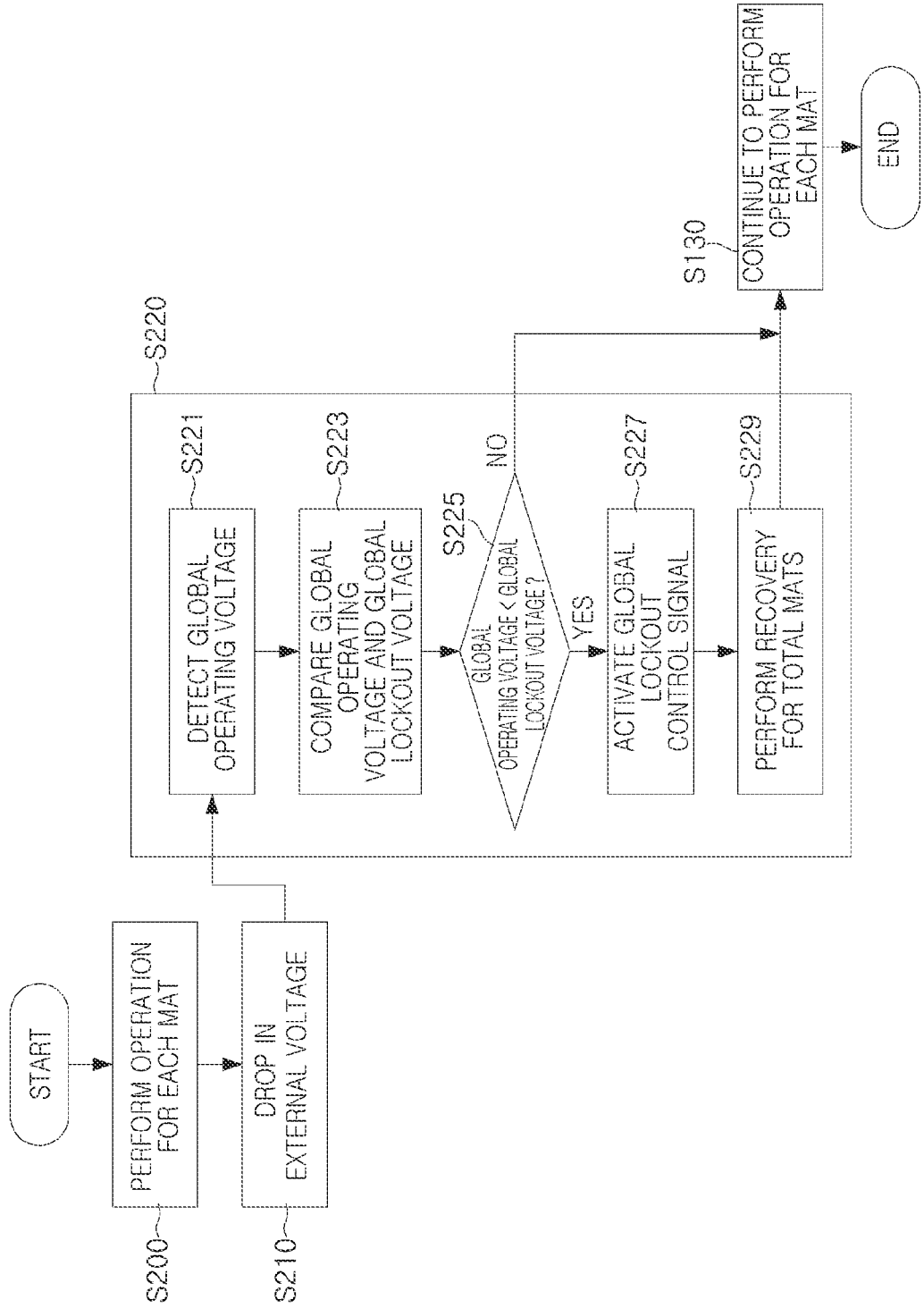
FIG. 11 is a flowchart illustrating a global lockout operation of a memory device according to an example embodiment.

FIG. 11 is a flowchart illustrating a global lockout operation of a memory device according to an example embodiment.

Referring to FIG. 11, a memory device according to an example embodiment may perform an operation for each MAT (S200). The operation of the MAT may be one of a read operation, a program operation, and an erase operation, and each of the MATs may perform different operations. Meanwhile, while each MAT is performing an operation, a situation in which it is difficult for each MAT to normally perform an operation may occur as an external voltage drop occurs (S210).

Local lockout circuits corresponding to each MAT may individually determine whether to lockout S210 and allow the peripheral circuit area to perform a lockout operation. However, if the external voltage drop is significant, it is not necessary to perform a lockout operation on each MAT; the global lockout circuit is used to determine whether to lockout as a whole, and the peripheral circuit area may perform lockout operation of the entire plurality of MATs (S220).

The global lockout circuit may detect the global operating voltage (S221) and compare the detected global operating voltage with the global lockout voltage (S223). The global lockout circuit may generate a global lockout control signal according to the level of the global operating voltage. In this case, when the global operating voltage is lower than the global lockout voltage, the global lockout circuit may activate the global lockout control signal so that the peripheral circuit area performs a lockout operation on all of the plurality of MATs (S225). On the other hand, when the global operating voltage is greater than the global lockout voltage, the peripheral circuit area may not perform the global lockout operation separately from the lockout operation based on the local lockout circuit (S225) and may continue to perform operations in the MATs (S230).

In order to perform a global lockout operation in the peripheral circuit area, the global lockout circuit may activate a global lockout control signal for the entire plurality of MATs (S227). Accordingly, the peripheral circuit area can stop the operation of the entire MAT. When the operation of the entire MAT is stopped, the peripheral circuit area may perform recovery on the entire MAT in order to perform the operation again (S229). For example, by performing recovery, an operation that has been performed may return to an initial state and an operating voltage may increase to a range in which the operation can be performed normally (S230). However, this is only an example embodiment and the present invention is not limited thereto thereto; and a subject performing the lockout operation and a process of the operation may be different according to example embodiments.

When the global lockout operation is not performed in S225, and when the lockout operation is performed and recovery is completed through the steps of S227-S229, the entire MAT may perform the operation again for each MAT (S230).

Figure 12:
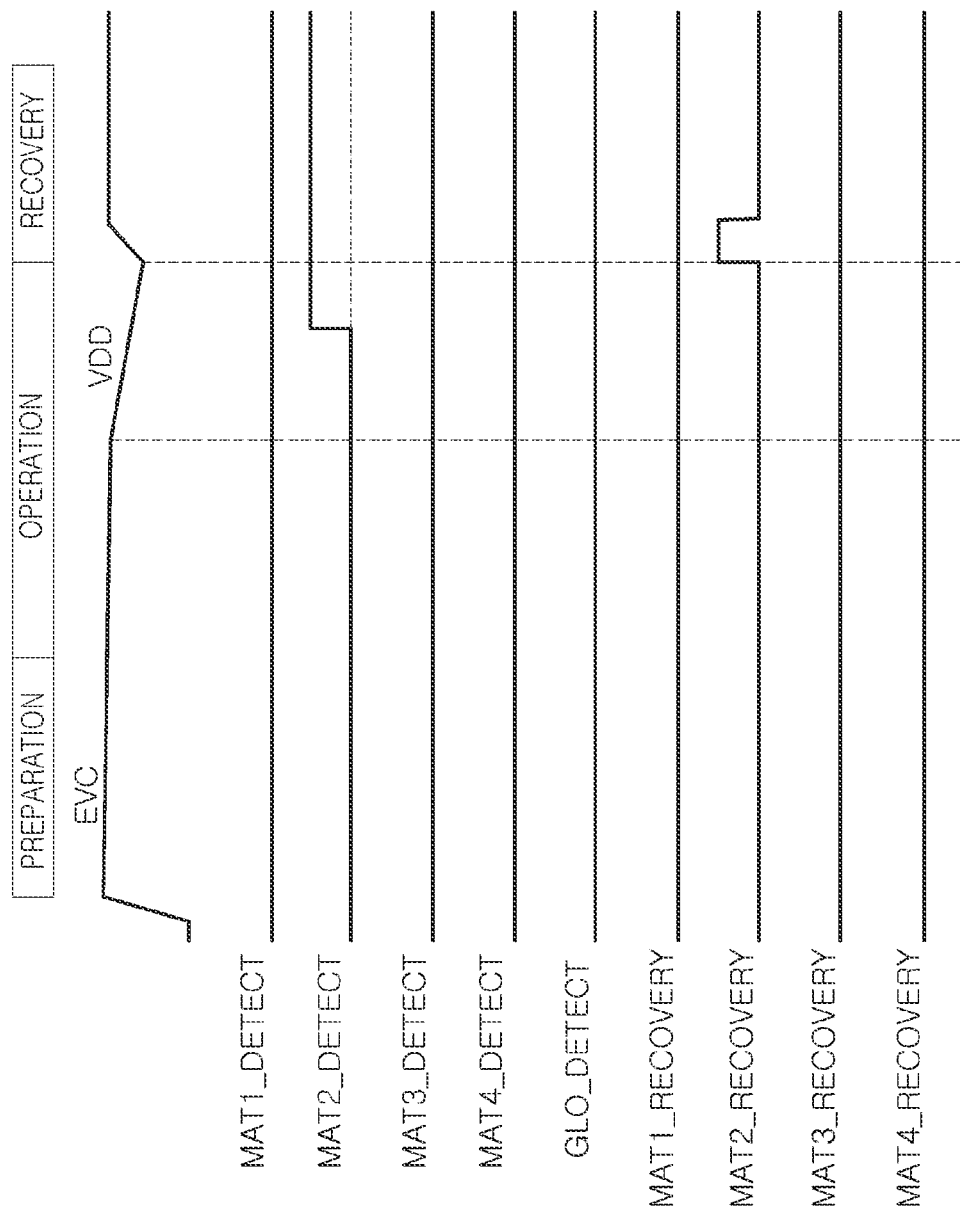
FIGS. 12 and 13 are diagrams illustrating a lockout operation of a memory device according to example embodiments.
Figure 13:
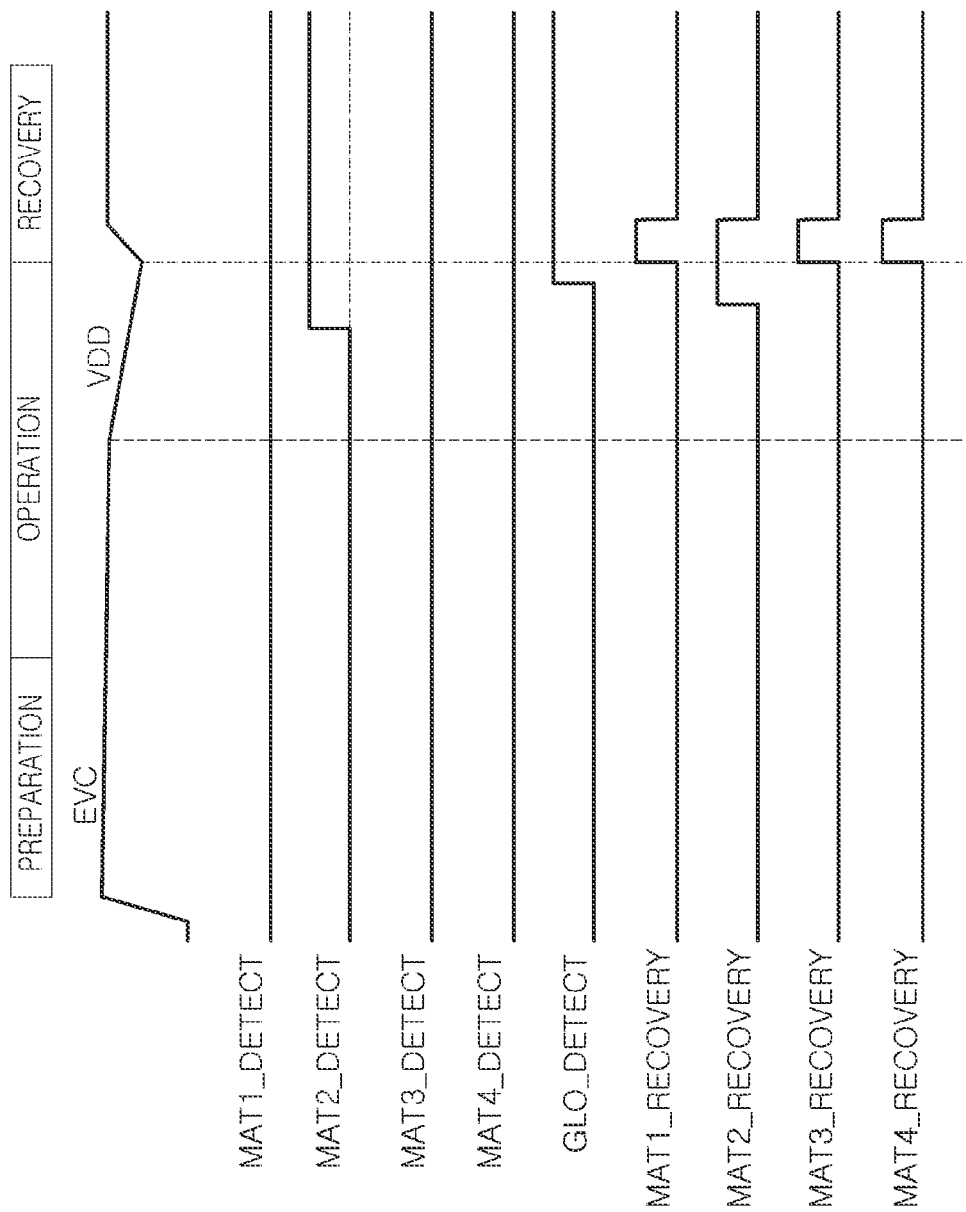

FIGS. 12 and 13 are diagrams illustrating a lockout operation of a memory device according to example embodiments.

Referring to FIG. 12, a lockout operation may be performed while each of a plurality of MATs MAT1, MAT2, MAT3, and MAT4 of a memory device, according to an example embodiment, performs separate operations. For example, when an operating voltage VDD lower than the lockout voltage is detected in one MAT, only the operation of the detected MAT is stopped and recovery may be performed. Referring to the drawing illustrated in FIG. 12, the one MAT may be a second MAT MAT2.

Meanwhile, a global lockout circuit that determines whether to lock out all of the plurality of MATs MAT1, MAT2, MAT3, MAT4 of the memory device according to example embodiments may operate independently of the local lockout circuit. In other words, whether or not the global detection signal GLO_DETECT is activated by the global lockout circuit may be separate from the operation of the local lockout circuit. For example, the global detection signal GLO_DETECT may be a global lockout control signal.

The process of applying the external power voltage EVC applied to the memory device according to the example embodiment to the plurality of MATs MAT1, MAT2, MAT3, and MAT4 may be similar to those illustrated and described in FIG. 7.

As an example, there may be a case where the global detection signal GLO_DETECT is not activated, and only the second detection signal MAT2_DETECT corresponding to the second MAT MAT2 is activated. Since the global detection signal GLO_DETECT is not activated, the lockout operation for the entire MAT may not be performed. However, as the second detection signal MAT2_DETECT corresponding to the second MAT MAT2 is activated separately, the lockout operation of the second MAT may be performed.

For example, by the activated second detection signal MAT2_DETECT, the peripheral circuit area corresponding to the second MAT MAT2 may stop the operation of the second MAT MAT2 and perform recovery. During recovery of the second MAT MAT2, the second recovery signal MAT2_RECOVERY may be activated. As an example, when the global detection signal GLO_DETECT is not activated in the memory device 20 according to the example embodiment, the same results may be obtained as those of the memory device 10 which is not include the global lockout circuit according to the example embodiment illustrated in FIG. 3.

Referring to FIG. 13, in a memory device according to an example embodiment, a global detection signal GLO_DETECT may be activated while a second detection signal MAT2_DETECT corresponding to a second MAT MAT2 is activated. First, similar to the memory device illustrated in FIG. 12, the peripheral circuit area corresponding to the second MAT MAT2, in response to the activated second detection signal MAT2_DETECT, may stop the operation of the second MAT MAT2 and perform recovery. During recovery of the second MAT MAT2, the second recovery signal MAT2_RECOVERY may be activated.

On the other hand, as the global detection signal GLO_DETECT is subsequently activated, the peripheral circuit area may stop the operation and may perform recovery of all MATs MAT1, MAT2, MAT3, MAT4 regardless of whether the detection signals MAT1_DETECT, MAT2_DETECT, MAT3_DETECT, MAT4_DETECT are activated. During recovery of the plurality of MATs MAT1, MAT2, MAT3, and MAT4, the first to fourth recovery signals MAT1_RECOVERY-MAT4_RECOVERY may be activated. Accordingly, a time in which the second recovery signal MAT2_RECOVERY is activated and a time in which the remaining recovery signals MAT1_RECOVERY, MAT2_RECOVERY, and MAT3_RECOVERY are activated may be different.

FIGS. 14A to 14D are schematic plan views of a memory device according to example embodiments.

Figure 14A:
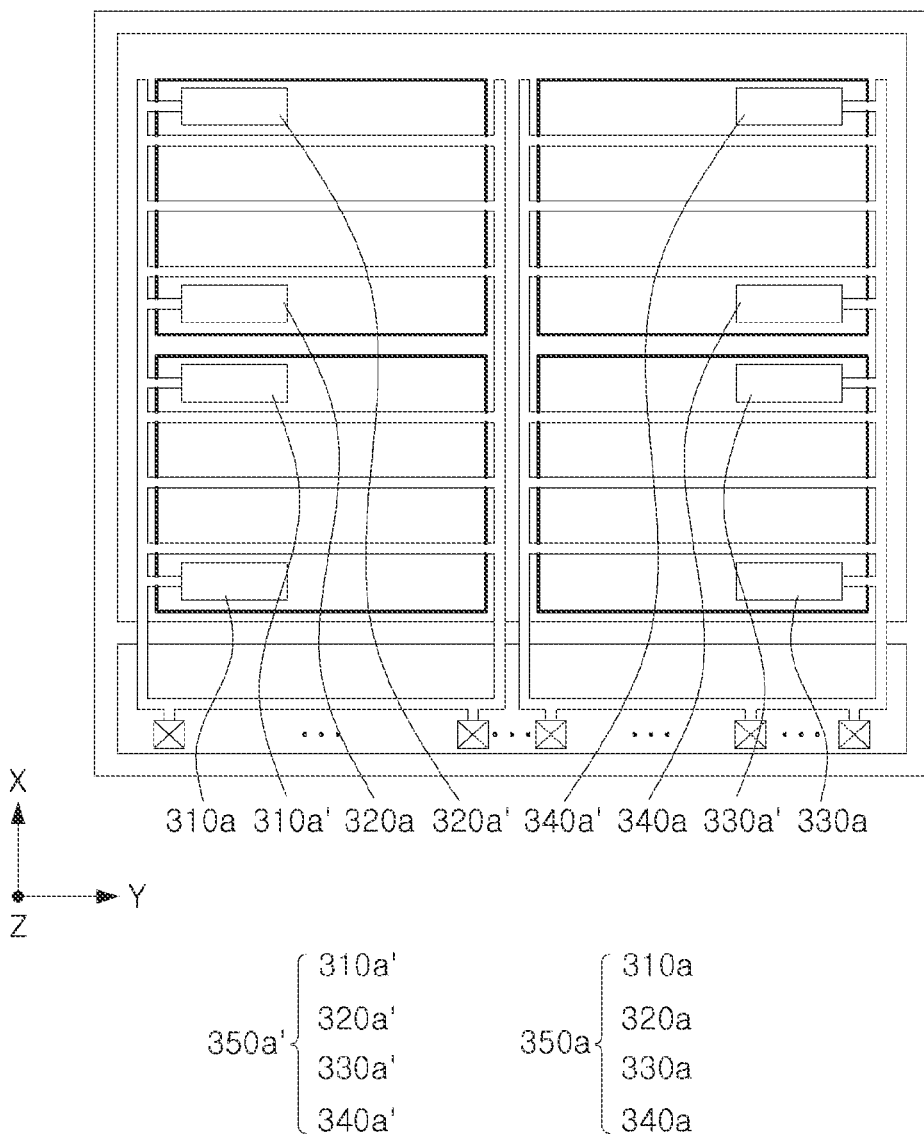
FIGS. 14A to 14D are schematic plan views of a memory device according to example embodiments.

Referring to FIG. 14A, in the memory device 30a according to an example embodiment, a plurality of MATs MAT1, MAT2, MAT3, MAT4 may each include two or more lockout circuits 350a and 350a'. In this case, each of the lockout circuits 350a and 350a' may be disposed at different positions of the MATs MAT1, MAT2, MAT3, and MAT4. For example, in the memory device 30a illustrated in FIG. 14A, the added lockout circuit 350a' may be disposed far from the pad area PAD and close to a wiring to which operation power is applied. For example, the added lockout circuit 350a' may be disposed at a corner adjacent to the corner where the lockout circuit 350a is disposed.

The operating voltage of each of the MATs MAT1, MAT2, MAT3, and MAT4 may be detected differently depending on the positions of the MATs MAT1, MAT2, MAT3, and MAT4 as well as the positions of the lockout circuits 350a and 350a'. Therefore, by determining whether to lock out from the lockout signals output from the lockout circuits 350a, 350a' arranged at a plurality of positions in the MATs (MAT1, MAT2, MAT3, MAT4), unnecessary lockout operation is prevented and the operation of the system may be stable.

For example, whether the first MAT MAT1 is locked out may be determined from lockout signals output from the first lockout circuits 310a and 310a', and whether the second MAT MAT2 is locked out may be determined from lockout signals output from the lockout circuits 320a and 320a'. Likewise, whether the third MAT MAT3 is locked out may be determined from lockout signals output from the third lockout circuits 330a and 330a', and whether the fourth MAT MAT4 is locked out is determined from lockout signals output from the lockout circuits 340a and 340a'.

Meanwhile, the plurality of MATs MAT1, MAT2, MA3, and MAT4 may further include a lockout controller corresponding to each. However, this is only an example embodiment and the present invention is not limited thereto, and the lockout controller may be disposed in the peripheral circuit area PERI. The lockout controller may determine whether to lock out each of the MATs MAT1, MAT2, MA3, and MAT4 by combining lockout signals input from the lockout circuits 350a and 350a'. The lockout controller may selectively activate the lockout signal according to the determined result.

As an example, the lockout controller may include an AND gate to determine whether to lockout from the logical product of the lockout signals. For example, it is possible to operate to lock out the MAT only when all lockout signals are activated. However, this is only an embodiment and the present invention is not limited thereto, and the lockout controller may determine whether to lockout in various ways.

Figure 14B:
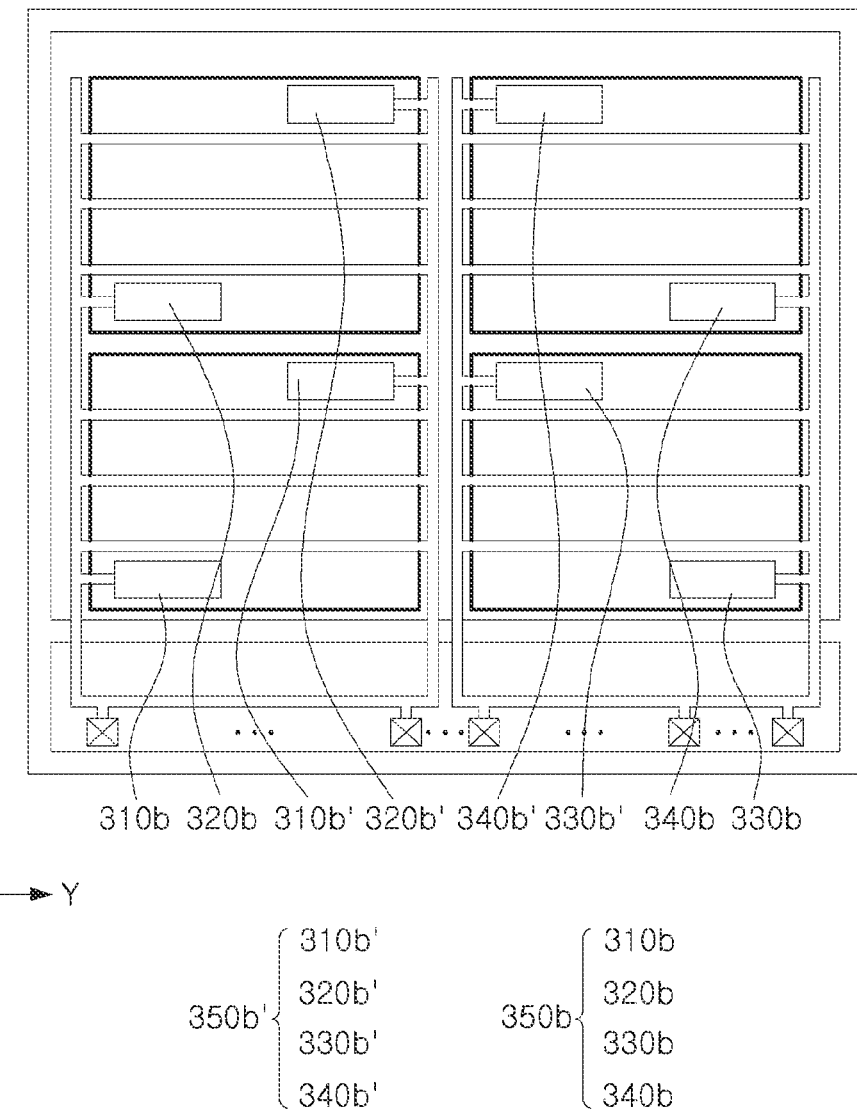

In addition, the arrangement of the additional lockout circuit 350a' is not limited thereto, and may have various arrangements according to embodiments. Referring to FIG. 14B, in the memory device 30b according to an example embodiment, an additional lockout circuit 350b' may be disposed far from the pad area PAD and away from a wiring to which operation power is applied. For example, the added lockout circuit 350b' (e.g., 310b'-340b') may be disposed at a corner not adjacent to the corner where the lockout circuit 350b (e.g., 310b-340b) is disposed.

Figure 14C:
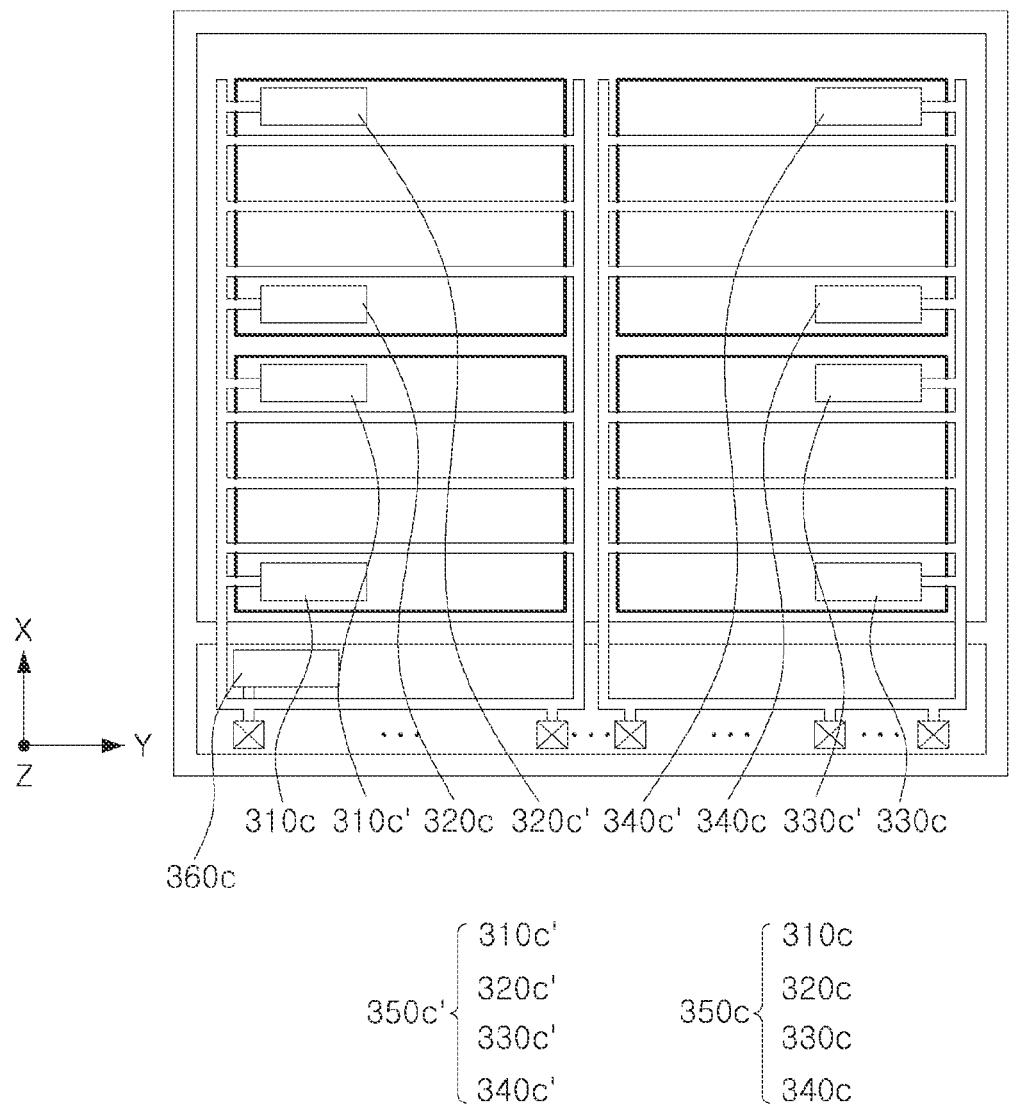
Figure 14D:
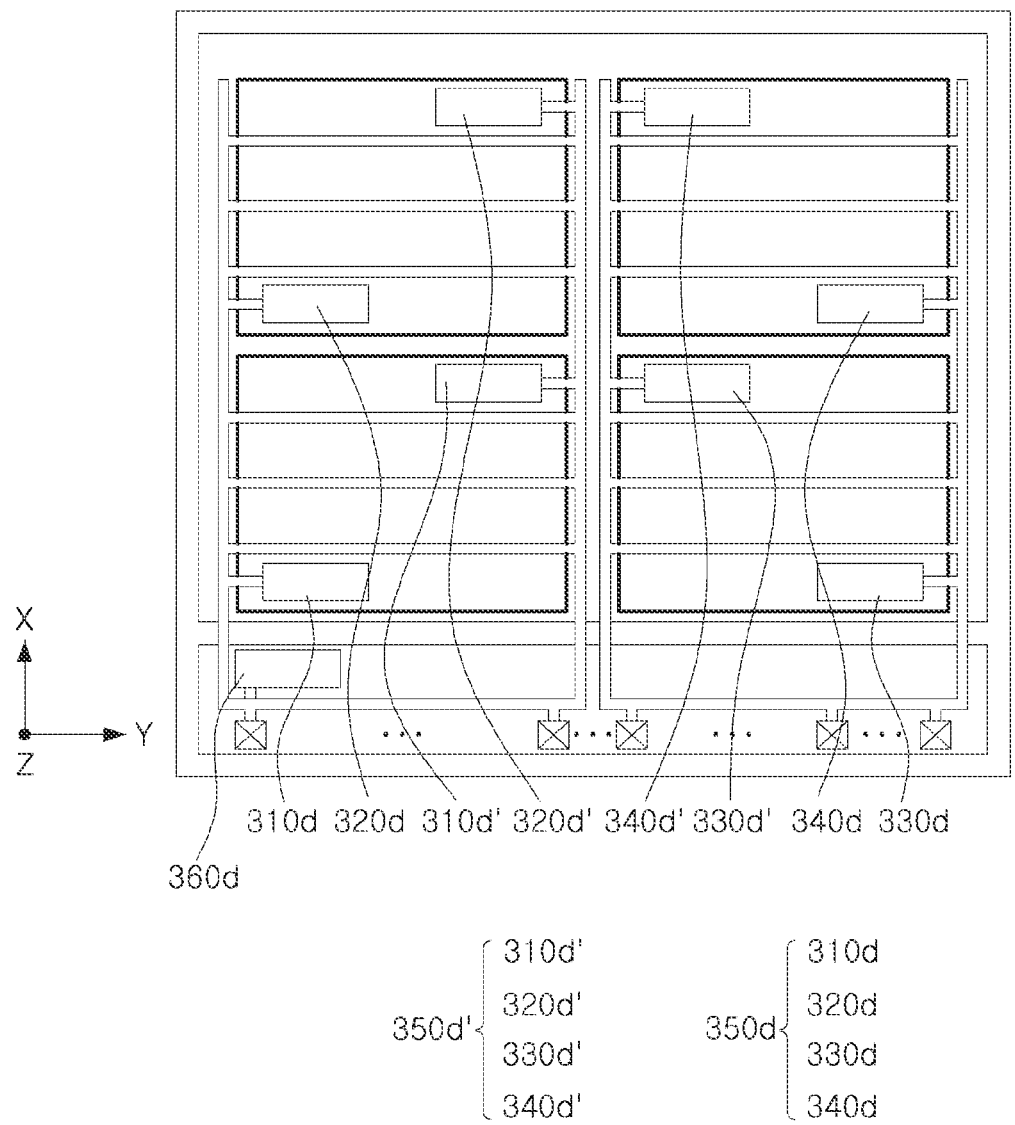

Meanwhile, referring to FIGS. 14C and 14D, additional lockout circuits 350c' (e.g., 310c'-340c'), 350c (e.g., 310c-340c), 350d' (e.g., 310d'-340d'), and 350d (e.g., 310d-340d) for preventing unnecessary lockout operation and stably operating the system are illustrated according to example embodiments.

Referring to FIGS. 10, 14C, and 14D, the memory devices 30c and 30d according to example embodiments include lockout circuits 350c and 350d, and additional lockout circuits 350c' and 350d', and may further include global lockout circuits 360c and 360d. However, these are only examples and the present invention is not limited thereto, and a lockout circuit may be selectively used according to the performance of the memory chip.

Figure 15:
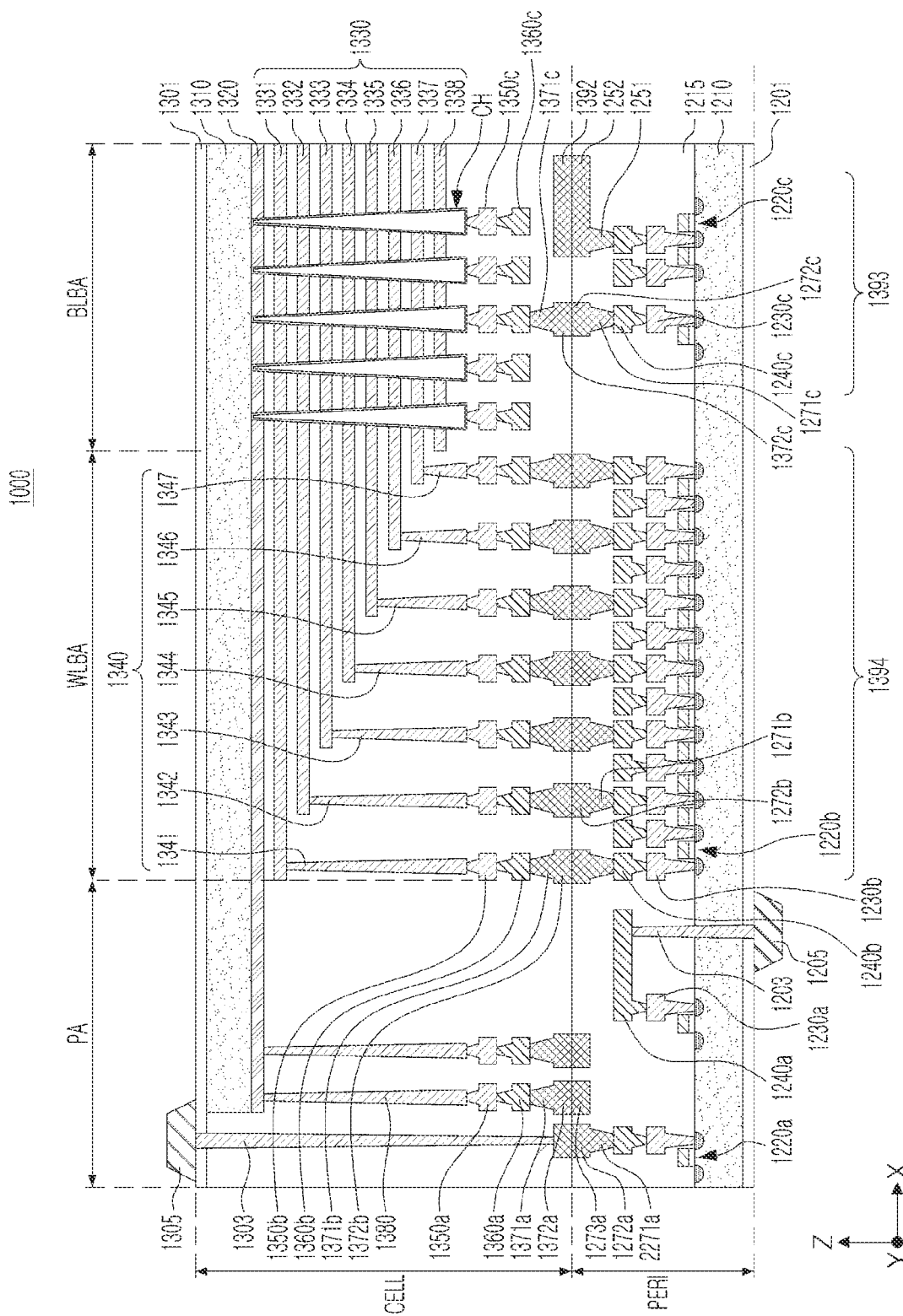
FIG. 15 is a diagram for describing a case in which a memory device according to an example embodiment has a chip-to-chip (C2C) structure.

FIG. 15 is a diagram for describing a case in which a memory device according to an example embodiment has a chip-to-chip (C2C) structure.

Referring to FIG. 15, the memory device 1000 may have a chip to chip (C2C) structure. In the C2C structure, an upper chip including a cell area (CELL) is fabricated on a first wafer, and a lower chip including a peripheral circuit area (PERI) is fabricated on a second wafer different from the first wafer. The upper chip and the lower chip nay be connected to each other by a bonding method. For example, the bonding method may refer to a method of electrically connecting a bonding metal formed on uppermost an uppermost metal layer of an upper chip and a bonding metal formed on an uppermost metal layer of a lower chip. For example, when the bonding metal is formed of copper (Cu), the bonding method may be a Cu—Cu bonding method, and the bonding metal may also be formed of aluminum or tungsten.

Referring to FIG. 2A, the memory cell area CELL and the peripheral circuit area PERI included in the memory device 10a according to the example embodiment may be connected to each other by a bonding method. As an example, the upper chip of the memory device 10a may include a memory cell area CELL including a first wafer and a plurality of MATs MAT1, MAT2, MAT3, MAT4 disposed thereon, and the lower chip of the device 10a may include a second wafer and a peripheral circuit area PERI including a plurality of semiconductor elements disposed thereon. Meanwhile, a lower bonding metal may be formed over the plurality of semiconductor devices included in the lower chip, and an upper bonding metal may be formed on the first wafer of the upper chip. For example, the lower bonding metal and the upper bonding metal may be electrically connected to each other. Accordingly, the plurality of semiconductor devices included in the lower chip apply an operating voltage to the plurality of MATs MAT1, MAT2, MAT3, and MAT4 included in the upper chip. A signal to control the operation of the semiconductor devices can be input.

According to an example embodiment, a lockout circuit 150a may be included among the plurality of semiconductor devices. Accordingly, the plurality of semiconductor devices included in the lower chip may be controlled to perform a lockout operation on the plurality of MATs MAT1, MAT2, MAT3, and MAT4 included in the upper chip. However, this is only an example embodiment and the present invention is not limited thereto, and as illustrated in FIG. 2B, the lockout circuit 150b may be disposed on one side of the memory cell area CELL. In this case, a signal for controlling a lockout operation of the plurality of MATs MAT1, MAT2, MAT3, and MAT4 may be directly transmitted within the memory cell area CELL.

Each of the peripheral circuit area PERI and the cell area CELL of the memory device 1000 illustrated by FIG. 15 may include an external pad bonding area PA, a word line bonding area WLBA, and a bit line bonding area BLBA.

The peripheral circuit area PERI includes a first substrate 1210, an interlayer insulating layer 1215, a plurality of circuit elements 1220a, 1220b, 1220c formed on the first substrate 1210, the first metal layers 1230a, 1230b, 1230c connected to each, and the second metal layers 1240a, 1240b, 1240c formed on the first metal layers 1230a, 1230b, 1230c. In one embodiment, the first metal layers 1230a, 1230b, and 1230c may be formed of tungsten having a relatively high resistance and the second metal layers 1240a, 1240b, and 1240c may be formed of copper having a relatively low resistance.

In an embodiment, only the first metal layers 1230a, 1230b, and 1230c and the second metal layers 1240a, 1240b, and 1240c are illustrated and described, but the description is not limited thereto. At least some of the one or more metal layers formed on the second metal layers 1240a, 1240b, and 1240c may be formed of aluminum or the like having a lower resistance than the copper forming the second metal layers 1240a, 1240b, and 1240c.

The interlayer insulating layer 1215 is a first substrate to cover the plurality of circuit elements 1220a, 1220b, 1220c, the first metal layers 1230a, 1230b, 1230c, and the second metal layers 1240a, 1240b, 1240c and is disposed on the first substrate 1210 and may include an insulating material such as silicon oxide or silicon nitride.

Lower bonding metals 1271b and 1272b may be formed on the second metal layer 1240b of the word line bonding region WLBA. In the word line bonding area WLBA, the lower bonding metals 1271b and 1272b of the peripheral circuit area PERI may be electrically connected to each other by a bonding method with upper bonding metals 1371b and 1372b of the cell area CELL. The lower bonding metals 1271b and 1272b and the upper bonding metals 1371b and 1372b may be formed of aluminum, copper, or tungsten.

The cell area CELL may provide at least one memory block. The cell area CELL may include a second substrate 1310 and a common source line 1320. On the second substrate 1310, a plurality of word lines 1331-1338 (i.e., 1330) may be stacked along a direction perpendicular to the top surface of the second substrate 1310 (Z-axis direction). String select lines and ground select lines may be disposed above and below each of the word lines 1330, and the plurality of word lines 1330 may be disposed between the string select lines and the ground select line.

In the bit line bonding region BLBA, the channel structure CH extends in a direction perpendicular to the upper surface of the second substrate 1310 to penetrate the word lines 1330, the string select lines, and the ground select line. The channel structure CH may include a data storage layer, a channel layer and a buried insulating layer, and the channel layer may be electrically connected to a first metal layer 1350c and a second metal layer 1360c. For example, the first metal layer 1350c may be a bit line contact, and the second metal layer 1360c may be a bit line. In one embodiment, the bit line 1360c may extend along a first direction (Y-axis direction) parallel to the top surface of the second substrate 1310.

In the example embodiment illustrated in FIG. 15, an area in which the channel structure CH and the bit line 1360c are disposed may be defined as the bit line bonding area BLBA. The bit line 1360c may be electrically connected to the circuit elements 1220c providing a page buffer 1393 in the peripheral circuit area PERI of the bit line bonding area BLBA. For example, the bit line 1360c is connected to upper bonding metals 1371c and 1372c in the peripheral circuit area PERI and the upper bonding metals 1371c and 1372c are connected to the circuit elements 1220c of the page buffer 1393 and lower bonding metals 1271c and 1272c.

In the word line bonding area WLBA, the word lines 1330 may extend in a second direction (X-axis direction) parallel to the top surface of the second substrate 1310 and a plurality of cell contact plugs 1341-1347 (i.e., 1340). The word lines 1330 and the cell contact plugs 1340 may be connected to each other by pads provided by extending at least some of the word lines 1330 to different lengths along the second direction X. A first metal layer 1350b and a second metal layer 1360b may be sequentially connected on top of the cell contact plugs 1340 connected to the word lines 1330. The cell contact plugs 1340 are peripheral circuits through the upper bonding metals 1371b and 1372b of the cell area CELL and the lower bonding metals 1271b and 1272b of the peripheral circuit area PERI in the word line bonding area WLBA.

The cell contact plugs 1340 may be electrically connected to the circuit elements 1220b providing a row decoder 1394 in the peripheral circuit area PERI. In an embodiment, operating voltages of the circuit elements 1220b providing the row decoder 1394 may be different from the operating voltages of the circuit elements 1220c providing the page buffer 1393. For example, the operating voltage of the circuit elements 1220c providing the page buffer 1393 may be greater than the operating voltage of the circuit elements 1220b providing the row decoder 1394.

A common source line contact plug 1380 may be disposed in the external pad bonding area PA. The common source line contact plug 1380 is formed of a conductive material such as a metal, a metal compound or polysilicon, and may be electrically connected to the common source line 1320. A first metal layer 1350a and a second metal layer 1360a may be sequentially stacked on the common source line contact plug 1380. For example, a region in which the common source line contact plug 1380, the first metal layer 1350a, and the second metal layer 1360a are disposed may be defined as the external pad bonding region PA.

Meanwhile, input/output pads 1205 and 1305 may be disposed in the external pad bonding area PA. Referring to FIG. 15, a lower insulating layer 1201 covering a lower surface of the first substrate 1210 may be formed under the first substrate 1210 and the first input/output pad 1205 may be formed on the lower insulating layer 1201. The first input/output pad 1205 is connected to at least one of the plurality of circuit elements 1220a, 1220b, 1220c disposed in the peripheral circuit area PERI through a first input/output contact plug 1203, and the lower insulating layer 1201 may be separated from the first substrate 1210. In addition, a side insulating layer is disposed between the first input/output contact plug 1203 and the first substrate 1210 to electrically separate the first input/output contact plug 1203 and the first substrate 1210.

Referring to FIG. 15, an upper insulating layer 1301 covering an upper surface of the second substrate 1310 may be formed on the second substrate 1310 and the second input/output pad 1305 may be formed on the upper insulating layer 1301. The second input/output pad 1305 may be connected to at least one of the plurality of circuit elements 1220a, 1220b, and 1220c disposed in the peripheral circuit area PERI through a second input/output contact plug 1303.

According to embodiments, the second substrate 1310 and the common source line 1320 may not be disposed in an area where the second input/output contact plug 1303 is disposed. Also, the second input/output pad 1305 may not overlap with the word lines 1330 in the third direction (Z-axis direction). Referring to FIG. 15, the second input/output contact plug 1303 is separated from the second substrate 1310 in a direction parallel to the top surface of the second substrate 1310, and an interlayer insulating layer 1215 of the cell area CELL may pass through and be connected to the second input/output pad 1305.

According to embodiments, the first input/output pad 1205 and the second input/output pad 1305 may be selectively formed. For example, the memory device 1000 includes only the first input/output pad 1205 disposed on the first substrate 1210 or the second input/output pad 1305 disposed on the second substrate 1310. Alternatively, the memory device 1000 may include both the first input/output pad 1205 and the second input/output pad 1305.

In each of the outer pad bonding area PA and the bit line bonding area BLBA included in each of the cell area CELL and the peripheral circuit area PERI, a metal pattern of the uppermost metal layer exists as a dummy pattern or the top metal layer may be empty.

In the external pad bonding area PA, the memory device 1000 corresponds to an upper metal pattern 1372a formed on the uppermost metal layer of the cell area CELL and the cell area CELL is formed on the uppermost metal layer of the peripheral circuit area PERI. A lower metal pattern 1273a having the same shape as the upper metal pattern 1372a may be formed. The lower metal pattern 1273a formed on the uppermost metal layer of the peripheral circuit area PERI may not be connected to a separate contact in the peripheral circuit area PERI. Similarly, in conjunction with the lower metal pattern formed on the uppermost metal layer of the peripheral circuit area PERI in the outer pad bonding region PA, the lower metal pattern of the peripheral circuit area PERI is formed on the upper metal layer of the cell area CELL. An upper metal pattern having the same shape may also be formed.

Lower bonding metals 1271b and 1272b may be formed on the second metal layer 1240b of the word line bonding region WLBA. In the word line bonding area WLBA, the lower bonding metals 1271b and 1272b of the peripheral circuit area PERI may be electrically connected to each other through a bonding method with the upper bonding metals 1371b and 1372b of the cell area CELL.

In addition, in the bit line bonding area BLBA, the uppermost metal layer of the cell area CELL corresponds to a lower metal pattern 1252 formed on the uppermost metal layer of the peripheral circuit area PERI. An upper metal pattern 1392 having the same shape as the metal pattern 1252 may be formed. A contact may not be formed on the upper metal pattern 1392 formed on the uppermost metal layer of the cell area CELL.

As set forth above, a memory device according to an example embodiment may determine whether to lock out in each of MATs performing different operations by including a lockout circuit corresponding to each MAT. Accordingly, a MAT whose operating voltage level is higher than a predetermined voltage level may be operated, while a MAT whose operating voltage level is lower than the predetermined voltage level may stop operation and perform recovery. In detail, unnecessary data loss may be reduced by distinguishing between a MAT that operates normally and a MAT that needs recovery.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

While example embodiments have been illustrated and described above, it will be apparent to those skilled in the art that modifications and variations could be made without departing from the scope of the present disclosure as defined by the appended claims.

What is claimed is:

1. A memory device comprising:
a first memory area including a first memory cell array having a plurality of first memory cells and a first peripheral circuit controlling the first memory cells and disposed below the first memory cell array;
a second memory area including a second memory cell array having a plurality of second memory cells and a second peripheral circuit controlling the second memory cells and disposed below the second memory cell array; and
a pad area including a power wiring, wherein:
the first memory area includes a first local lockout circuit determining whether to lock out during an operation of the first memory area,
the second memory area includes a second local lockout circuit determining whether to lock out separately from the first memory area during an operation of the second memory area,
the first memory area and the second memory area are included in a single semiconductor chip to share the pad area, and
while the first memory area performs a first operation, the second memory area performs a second operation, and each of the first operation and the second operation is a program operation, a read operation, or an erase operation.

2. The memory device of claim 1, wherein:
the first local lockout circuit generates a first lockout control signal,
the first peripheral circuit stops the first operation of the first memory area and performs recovery of the first memory area, when the first lockout control signal is activated,
the second local lockout circuit individually generates a second lockout control signal, and
the second peripheral circuit stops the second operation of the second memory area and performs recovery of the second memory area, when the second lockout control signal is activated.

3. The memory device of claim 2, wherein:
the first local lockout circuit activates the first lockout control signal when a first operating voltage of the first memory area is lower than a lockout voltage during the first operation of the first memory area, and
the second local lockout circuit activates the second lockout control signal when a second operating voltage of the second memory area is lower than a lockout voltage during the second operation of the second memory area.

4. The memory device of claim 3, wherein the lockout voltage during the first operation of the first memory area and the lockout voltage during the second operation of the second memory area are respectively determined according to an operation performed in the first memory area and the second memory area.

5. The memory device of claim 1, wherein the first memory area operates at a first operating voltage and the second memory area operates at a second operating voltage different from the first operating voltage.

6. The memory device of claim 5, wherein:
the first operating voltage is determined depending on a length of a first power wiring connecting a power pad receiving external power and the first memory area,
the second operating voltage is determined depending on a length of a second power wiring connecting the power pad and the second memory area, and
the length of the first power wiring is shorter than the length of the second power wiring.

7. The memory device of claim 1, wherein a magnitude of a voltage drop occurring in the first memory area performing the first operation is different from a magnitude of a voltage drop occurring in the second memory area performing the second operation.

8. The memory device of claim 7, wherein each of the first local lockout circuit and the second local lockout circuit includes a variable resistor configured to adjust an operating voltage depending on operations of the first memory area and the second memory area.

9. The memory device of claim 1, wherein the first local lockout circuit and the second local lockout circuit are disposed in positions in which a length of each of wirings extending from a power pad to the first local lockout circuit and the second local lockout circuit is relatively shortest.

10. The memory device of claim 1, further comprising:
a global lockout circuit disposed in the pad area, wherein the global lockout circuit determines whether to lock out both the first memory area and the second memory area.

11. The memory device of claim 10, wherein the global lockout circuit generates a global lockout control signal according to a level of a global operating voltage.

12. The memory device of claim 11, wherein the global operating voltage is different from an operating voltage of the first memory area and an operating voltage of the second memory area.

13. The memory device of claim 11, wherein the global lockout circuit activates the global lockout control signal when the global operating voltage is lower than a global lockout voltage.

14. The memory device of claim 13, wherein when the global lockout control signal is not activated and a lockout control signal corresponding to the first memory area or the second memory area is activated, each of the first peripheral circuit and the second peripheral circuit stops an operation of a memory area corresponding to the lockout control signal that is activated and performs recovery of the memory area.

15. The memory device of claim 13, wherein when the global lockout control signal is activated, the first peripheral circuit and the second peripheral circuit stop operations of the first memory area and the second memory area and perform recovery of each of the first memory area and the second memory area.

16. A memory device comprising:
a memory cell area including a plurality of Memory Array Tiles (MATs) each including a plurality of memory cells;
a peripheral circuit area disposed below the memory cell area; and
a pad area disposed on a side surface of the memory cell area and including a power wiring, wherein:
the plurality of MATs perform an operation individually by an operating voltage applied based on external power,
the peripheral circuit area individually stops the operation and performs recovery, when the operating voltage is lower than a lockout voltage during the operation of the plurality of MATs, and
the memory cell area includes at least two MATs having the operating voltage and the lockout voltage different from each other.

17. A memory device comprising:
a memory cell area including a first metal pad;
a peripheral circuit area including a second metal pad;
a pad area disposed on a side surface of the memory cell area and including a wiring applying external power to the peripheral circuit area;
a plurality of Memory Array Tiles (MATs) included in the memory cell area and each including a plurality of memory cells; and
a lockout circuit respectively disposed in the plurality of MATs or in the peripheral circuit area below the plurality of MATs, wherein:
the peripheral circuit area is vertically connected to the memory cell area by the first metal pad and the second metal pad and applies an operating voltage to the plurality of MATs, based on the external power applied from the pad area,
the plurality of MATs operate individually by the operating voltage, and
the lockout circuit individually determines whether to lock out the plurality of MATs.

18. The memory device of claim 17, wherein the first metal pad and the second metal pad are formed of copper.

19. The memory device of claim 17, wherein the first metal pad and the second metal pad are connected in a bonding manner.

20. The memory device of claim 17, wherein the memory cell area is disposed on a first wafer and the peripheral circuit area is disposed on a second wafer.

* * * * *